United States Patent [19]

Henry et al.

[11] 3,938,104

[45] Feb. 10, 1976

[54] SYSTEM FOR MODIFYING A LOGIC CONTROLLER INSTRUCTION SET

[75] Inventors: Raymond W. Henry, Dallas, Tex.; Anthony F. Zizzo, Phoenix, Ariz.

[73] Assignee: Texas Instruments Incorporated, Dallas, Tex.

[22] Filed: Jan. 7, 1974

[21] Appl. No.: 431,442

[52] U.S. Cl. .......................................... 340/172.5
[51] Int. Cl.² ........................................... G06F 3/02
[58] Field of Search ...................... 340/172.5; 445/1

[56] References Cited
UNITED STATES PATENTS

| | | | |
|---|---|---|---|
| 3,686,639 | 8/1972 | Fletcher et al. | 340/172.5 |
| 3,701,113 | 10/1972 | Chace et al. | 340/172.5 |
| 3,810,118 | 5/1974 | Kiffmeyer | 340/172.5 |
| 3,813,649 | 5/1974 | Struger et al. | 340/172.5 |

*Primary Examiner*—Harvey E. Springborn
*Attorney, Agent, or Firm*—Harold Levine; Edward J. Connors, Jr.; Stephen S. Sadacca

[57] ABSTRACT

A programmable logic controller includes a read/write memory for storing multi bit instructions which direct computations in the controller in response to a programming keyboard module connected to the controller for encoding instructions to be stored in controller memory. Keyboard commands transfer instructions from the module to said memory in an ordered array. Instructions are read from memory serially, cyclically and non destructively for operation of the controller. A keyboard insert command inserts a new instruction at a designated address in memory and sequentially shifts each serially accessed instruction in memory stored at an address beyond the designated address to a memory address once removed.

10 Claims, 20 Drawing Figures

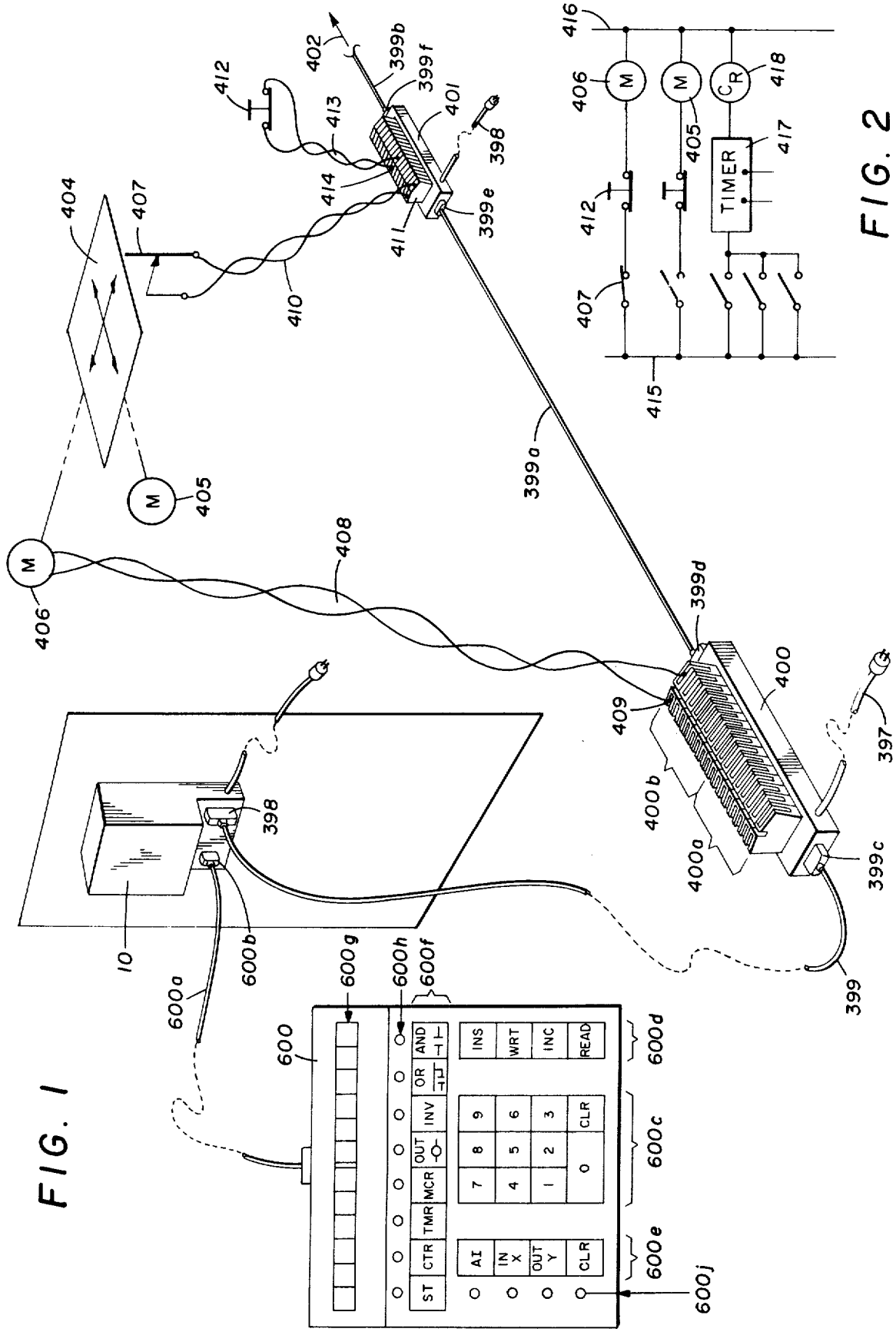

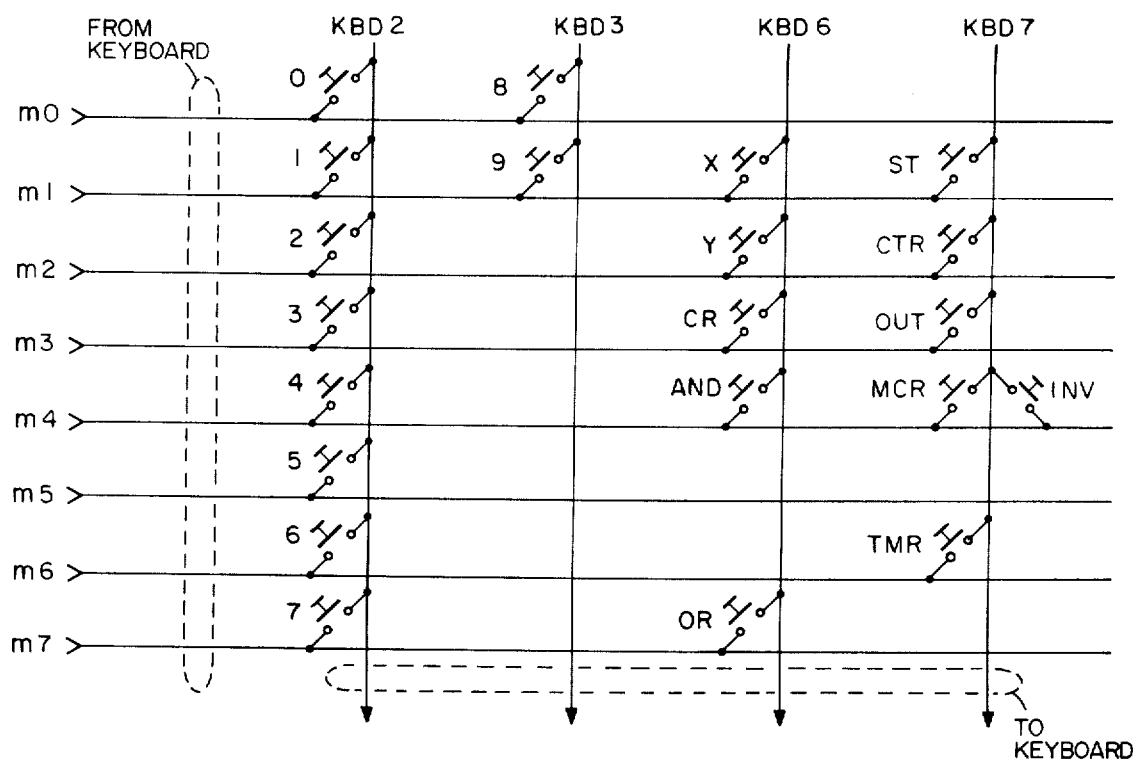
FIG. 1a
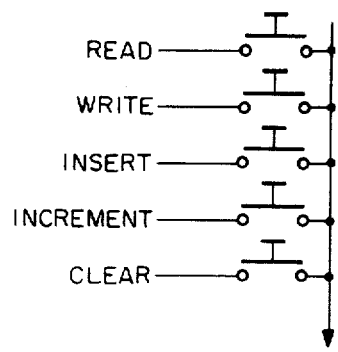
FIG. 1b
| FIG. 3 | FIG. 4 |
| FIG. 7 | FIG. 8 |
| FIG. 9 | FIG. 10 |
| FIG.11a | FIG.11b | FIG.11c |
| FIG.13 | FIG.14 |
FIG. 12

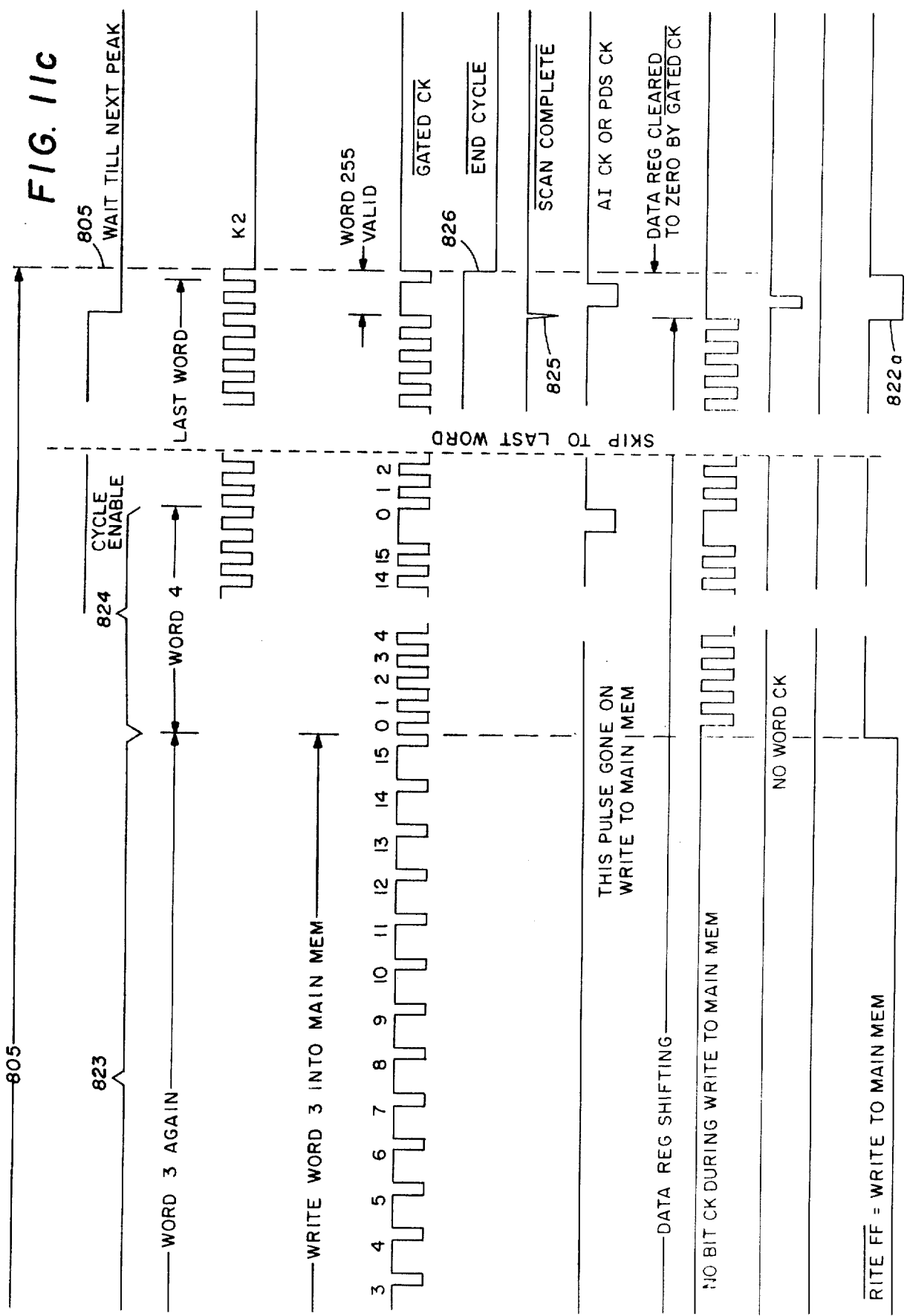

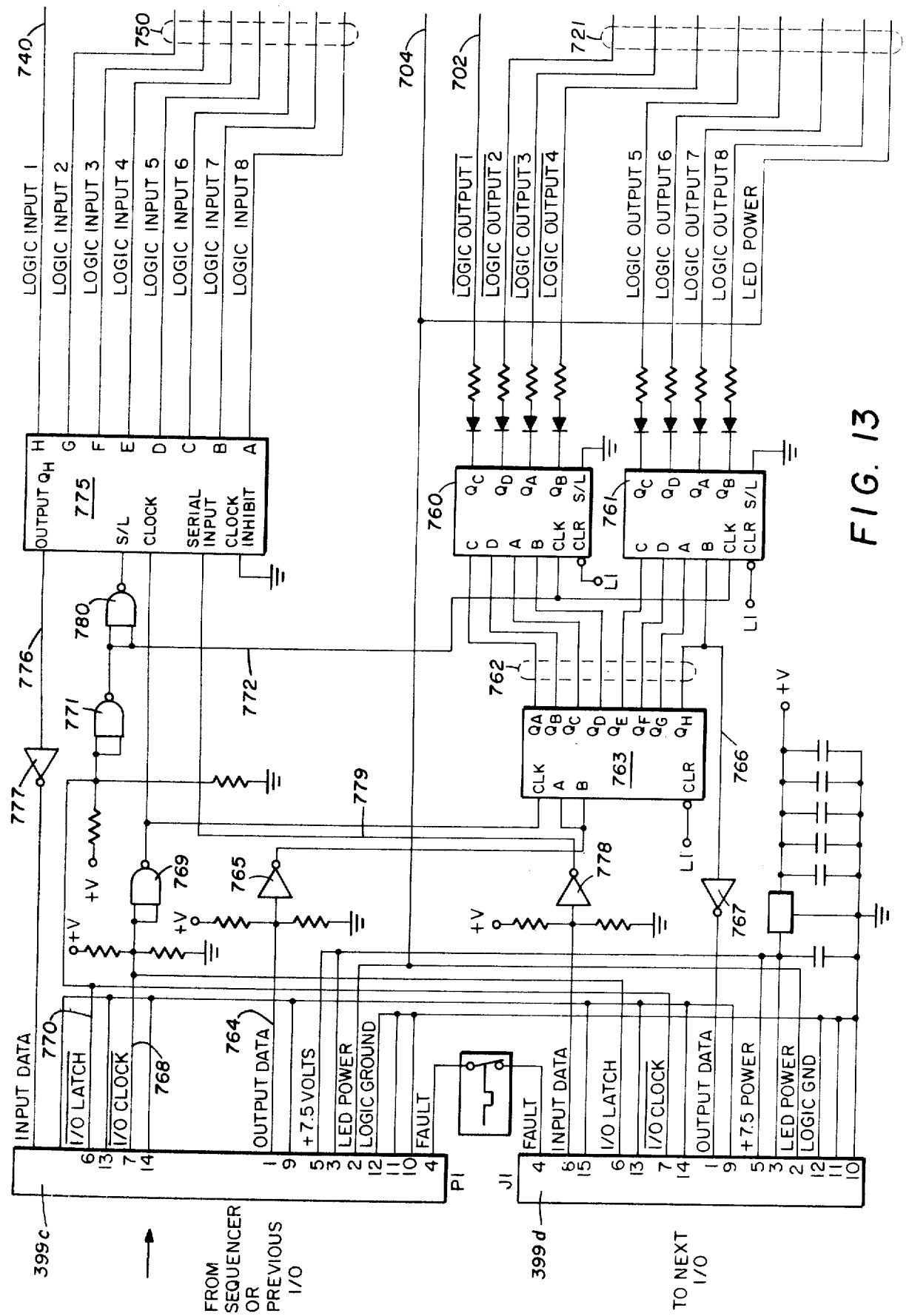

SYSTEM FOR MODIFYING A LOGIC CONTROLLER INSTRUCTION SET

BACKGROUND OF THE INVENTION

This invention relates to a hardware implemented system for inserting new instructions into a programmed set of instructions in memory in a functional sequencer. In a more specific aspect, the invention is related to a programmable logic controller having a keyboard module connected thereto in which there is provided a shift register for storage of new instructions and a counter in which the memory location at which the new instruction is to be placed is loaded and is counted down to zero beginning at the start of a memory cycle at which time the instruction in memory at the desired location is shifted into the shift register concomitantly with the shifting of the instruction from the shift register to memory followed by circulation through the shift register of all subsequent instructions stored in memory.

The present invention relates generally to devices known as programmable logic controllers. Controllers have heretofore been provided to control machines, processes, solenoids, motors, etc. Such controllers in general have a large number of output storage devices associated therewith, which devices are employed to connect power sources to machine elements or disconnect the same at times predicated upon conditions in the system and the relation of such conditions to a programmed set of instructions stored in a memory in the controller. Multiple relay installations have heretofore been employed to provide condition dependent control of machines or devices powered from alternating current sources. The installations have been made by guidance provided through electrical circuit diagrams in the form of ladder networks. Several attempts to solve problems encountered in simplifying installation procedures and operations are found in "Control Engineering", September 1972, page 45 et seq.

In the use of systems under direction of programmable logic controllers, it frequently becomes necessary to make physical changes in the system, adding more operative elements which must be controlled by the controller. In such controllers, or other functional computers, programmed sets of instructions ar stored within memory in response to which computations or sequences in the controller are directed. At times it, therefore, becomes necessary that the instruction set must be modified by adding an instruction somewhere in the programmed set.

In the computer art generally, the insertion of instructions in a programmed set has heretofore been carried out with software. The present invention provides a hardware insert function which allows more direct modification of the instruction set than with a separate software routine and in a manner uniquely and readily carried out without familiarity with conventional programming techniques.

SUMMARY OF THE INVENTION

In accordance with the present invention, there is provided a programming keyboard module connected to the controller for encoding instructions to be stored in a read/write memory in the controller. The keyboard module includes a shift register and a counter. A new instruction is manually loaded into the shift register. A memory location where it is to be placed is loaded into the counter. At the start of the memory cycle, the counter begins to count down. When the count reaches zero, the instruction that was already in memory at the designated location serially is shifted into one end of the shift register. At the same time, the new instruction is serially shifted out of the other end of the shift register into the designated memory location. Essentially the new and old instruction exchange places. The next instruction from memory then passes serially through the shift register while the word in shift register is shifted into the next memory location. The process is continued until all the instructions following the added instruction have been repositioned to the next memory location.

BRIEF DESCRIPTION OF THE DRAWINGS

The novel features believed characteristic of the invention are set forth in the appended claims. The invention itself, however, as well as further objects and advantages thereof, will best be understood by reference to the following detailed description of an illustrative embodiment taken in conjunction with the accompanying drawings, in which:

FIG. 1 illustrates a programmable timer installation;

FIGS. 1A and 1B illustrate the keyboard switching matrix of FIG. 1;

FIG. 2 illustrates a typical ladder network representing the system of FIG. 1;

FIGS. 11A-11E are timing diagrams;

FIG. 12 illustrates the relationships between FIGS. 3 and 4, between FIGS. 7-10, 11A-11C, and between FIGS. 13 and 14; and FIGS. 13 and 14 illustrate the I/O units employed herein.

DESCRIPTION OF THE PREFERRED EMBODIMENTS

Figure 3:
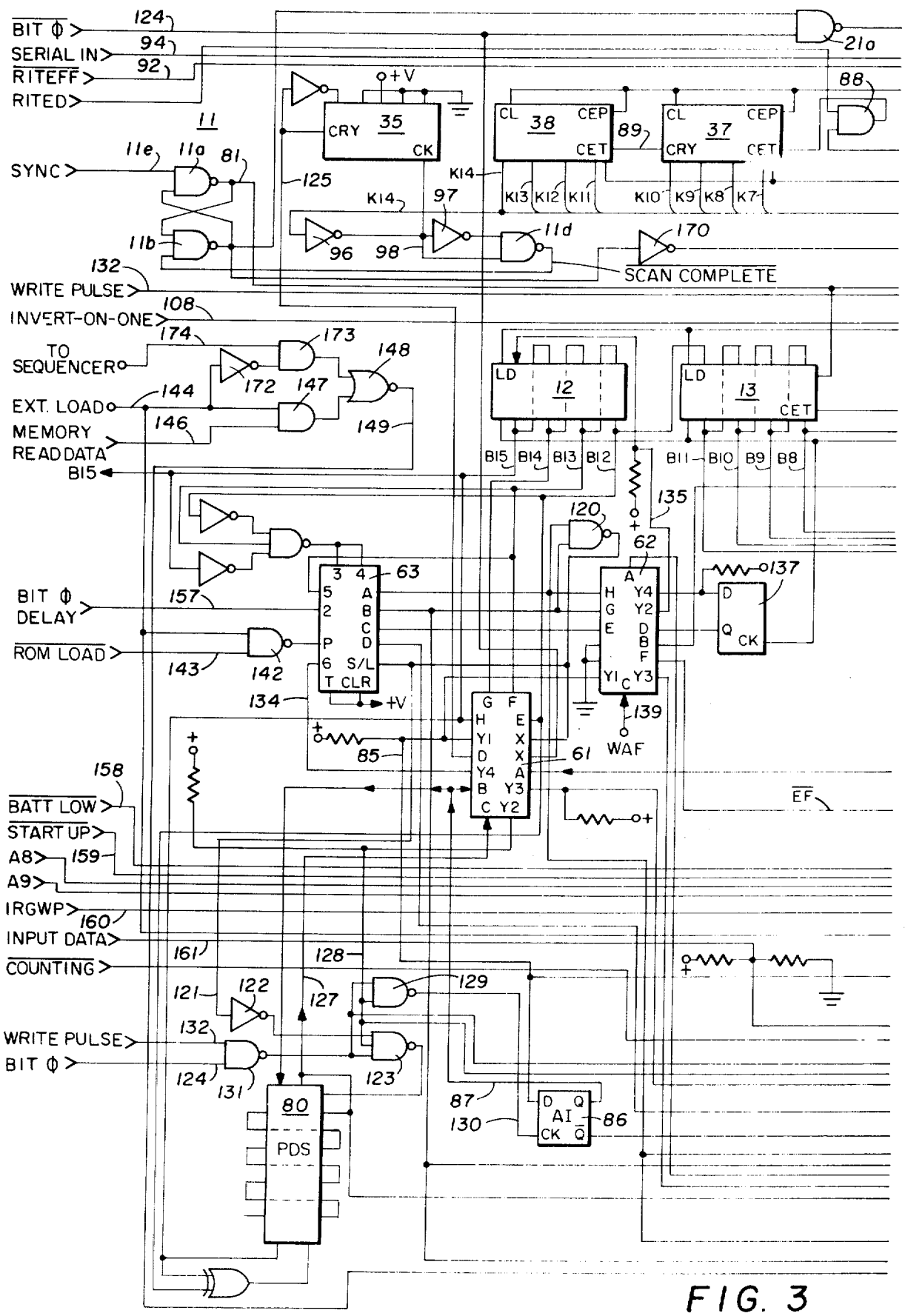
FIGS. 3 and 4 illustrate the main section of the sequencer.

The present invention is directed specifically to a hardware implementation conveniently to modify an instruction set stored in memory in a sequencer. In a more specific aspect, it involves cooperation between the sequencer unit and the keyboard programming unit pursuant to which instructions stored in the sequencer memory may be serially read from memory through the programming unit and back to memory at addresses which are displaced by one address location from the address from which a given instruction was read.

FIG. 1

FIG. 1 illustrates a programmable logic controller 10 connected by way of a plug 398 and a multiconductor cable 399 to an I/O base unit 400 and thence by cable 399a to an I/O base unit 401 with a cable 399b extending in the direction of arrow 402 to additional I/O units that may be located at any desired points. The programmable controller 10 is a hard wired self-contained process sequencer and controller which is programmed from a plug-in input unit 600. Unit 600 is connected by way of cable 600a through a plug 600b to unit 10.

The I/O base 400 has a plurality of I/O connectors such as connector 409 to accommodate different circuit elements. I/O base 401 also has a plurality of I/O connectors such as connectors 411 and 414. The connectors are used, for example, in the control of an X/Y table 404. A motor 405 drives table 404 along one axis. A motor 406 drives table 404 along another axis. A limit switch 407 is positioned to be actuated when physically engaged by table 404. Motor 406 is connected by conductors 408 to output connector 409 and the I/O base 400. Switch 407 is connected by conductors 410 to input connector 411 on I/O base 401. A push-button switch 412 is connected by conductors 413 to input connector 414 on base 401.

Programmable controller 10 is used, for example, to energize motor 406 only when both switches 407 and 412 are closed. Such action would be in response to control states stored in a memory in unit 10. The memory in unit 10 may be loaded with the desired control states by way of the input unit 600.

I/O base 400 in this example provides eight input connectors 400a and eight output connectors 400b. Similarly, I/O base 401 provides eight input connectors 401a and eight output connectors 401b.

FIG. 2

The system operates in response to instruction voltage states loaded in the language of ladder networks normally employed in the wiring of power control systems. For example, FIG. 2 illustrates a typical ladder network wherein limit switch 407 and push-button switch 412 are connected in series with motor 406 between power conductors 415 and 416 which are included in power cable 397 leading to base 400, FIG. 1. In a similar manner, motor 405 is connected in series with like control elements between lines 415 and 416. A third circuit connected across lines 415 and 416 may comprise three switches in parallel leading to a timer 417 and a control relay 418 where the timer is operative when any one of the switches connected thereto is closed.

In the embodiment of the invention which is described herein, 256 output elements like element 409, and 256 input elements like elements 411 and 414, may be accommodated. The system illustrated in FIG. 1 provides for storing instructions for implementing many paths in a ladder diagram. The embodiment is expandable to accommodate many more elements included in a system represented by a ladder diagram. This is accomplished by using in a unique manner a nonaddressed push down storage stack for temporary storage of intermediate results of programmed manipulations which will operate equally well with Boolean equations which may be broken into subgroups and each subgroup separately stored in a push down stack and thereafter combined to produce final results of the Boolean relationship. While only simple ladder elements are illustrated in FIG. 2, the system illustrated in FIG. 1 is versatile in that an almost unlimited number of rungs may be accommodated in the ladder network with unlimited number of elements in a given rung or line.

The construction employed for controller 10, the I/O bases 400 and 401 and the control module 600 will now be described. It will be understood that the unit 600 is to be employed only to program a controller. In operation, the plug 600b would be inserted only while the desired ladder network is being entered into controller 10. Thereafter, plug 600b would be removed and unit 600 would be available for use for programming additional controllers located elsewhere.

PROGRAMMABLE CONTROLLER 10 – FIGS. 3–6

Programmable controller 10 illustrated in FIGS. 3–6 has the following distinct functional sections.

Figure 4:
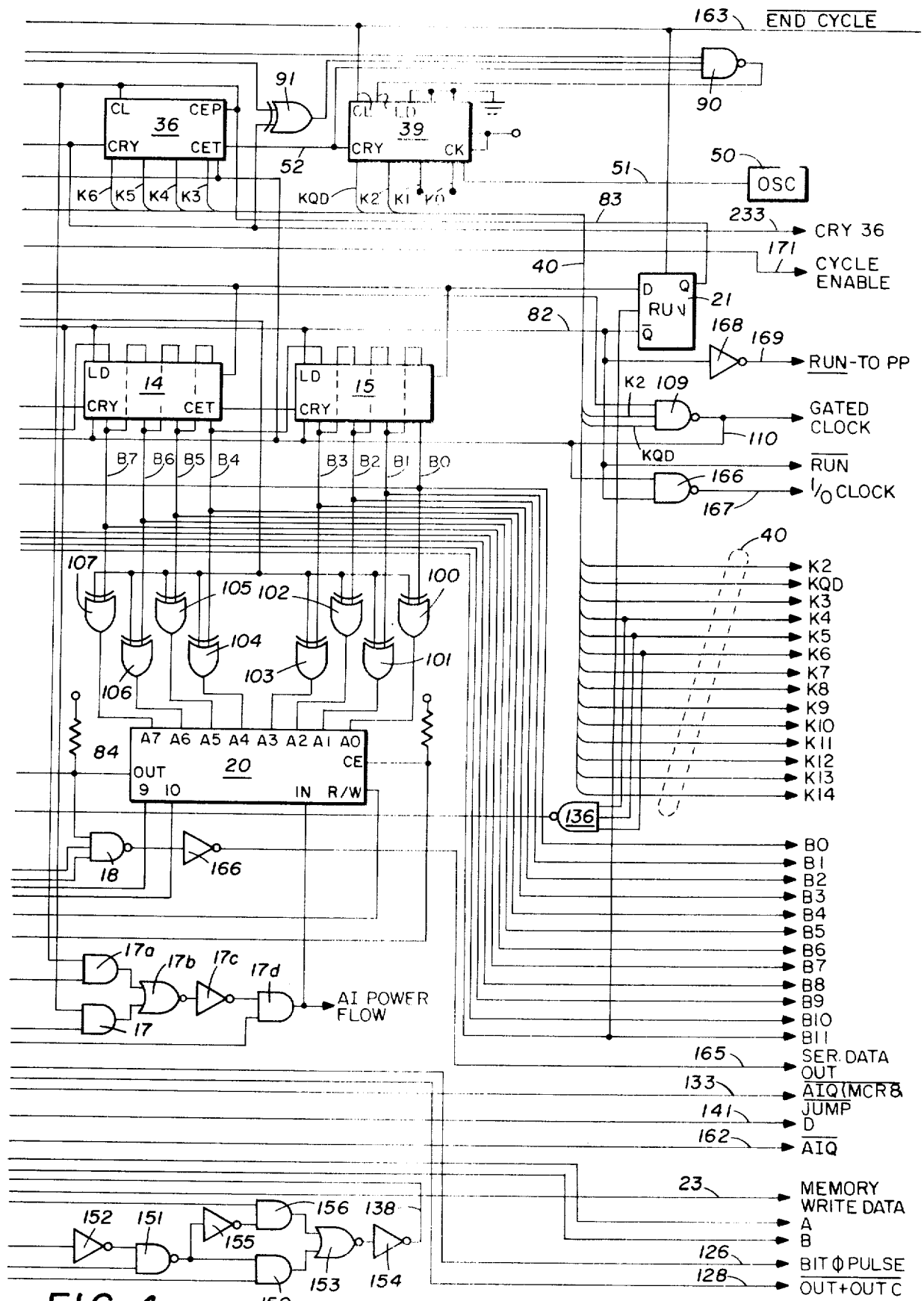

Counter — Data Register — FIGS. 3 and 4

Units 12—15 serve as serial I/O counters when operating in a serial I/O mode and as memory instruction registers when operating in a run mode. They operate in conjunction with an image register 20 as will hereinafter be explained.

Bit and Instruction Counter — FIGS. 3 and 4

Units 36–38 are interconnected to form a bit and instruction counter for synchronizing and controlling the sequencing operations in the unit.

Scan Cycle Counter — FIG. 3

A counter 35 serves to count scan cycles that have been completed in order to assist timing operations as may be required when timing units such as unit 417, FIG. 2, are to be employed.

Processor — FIG. 3

Units 61, 62 and 63 serve as primary processor elements. Element 61 is a main decoder and processor ROM. Unit 62 is a timer-counter processor ROM. Unit 63 is a timer-counter state storage unit.

Sync Latch — FIG. 3

Through a sync latch 11, a start pulse is transmitted to initiate each cycle of the controller. Controller 10 works normally in conjunction with devices powered from 110 volt lines 415, 416, FIG. 2. Controller 10 operates through a complete cycle within the time limits of each half cycle of the power voltage. An input sync pulse applied to terminal 11e of sync latch 11 is caused to occur at the peak of each half wave of the power voltage.

Figure 5:
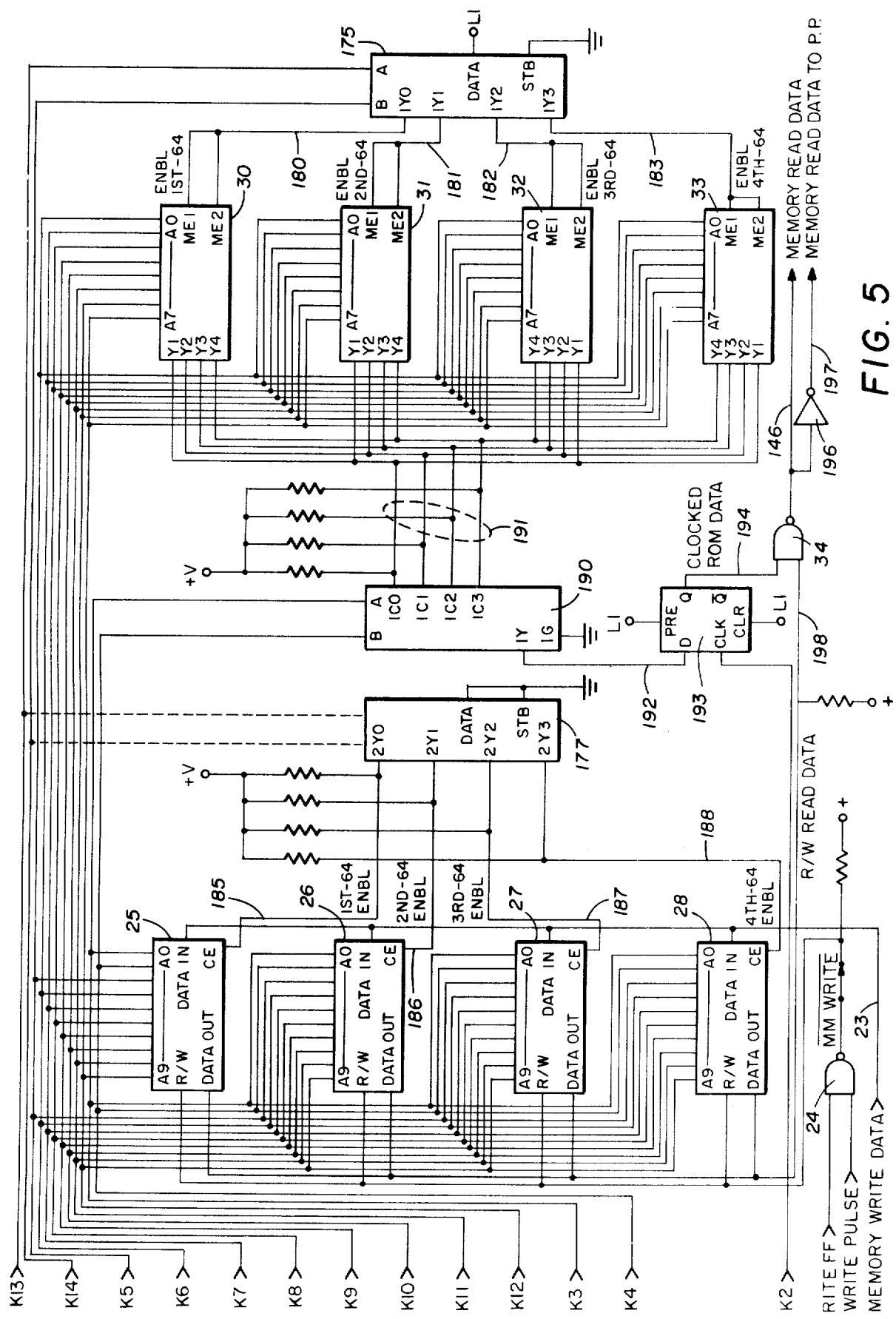
FIG. 5 illustrates the memory sections of the sequencer.

Upon generation of each sync pulse, signals indicating the states of all of the control elements in the ladder network, such as switches 407, 412, etc., FIG. 2, are read into the controller and stored in the image register 20 by way of a data input AND gate 17. After reading data in, newly generated control states are fed out of controller 10 by way of cable 399, one circuit of which leads from data out NAND gate 18. Thereafter, all instructions in memory 25–28 or 30–33, FIG. 5, are reviewed and new output data is created. The cycle is thus completed and the controller waits for the next peak in the power voltage to initiate another controller cycle.

Output data from gate 18 is stored in shift register memories in units 400, 401, etc., FIG. 2. Such memories, in the form of dual output registers, store output data which establishes control conditions for a given time interval as will be explained in connection with FIGS. 13 and 14. During such interval, new output data is stored in the other part of the dual output register.

Control is shifted from data in one half of the output register to data in the other half of the output register upon each zero crossing of the power voltage waveform.

Push Down Stack – FIG. 3

Unit 80 is a one bit word width push-down stack. Results of logical calculations made by other parts of the controller are stored in this push-down stack. The results may be retrieved at will in the opposite order to which they were stored. The length of the push-down stack 80 in a practical sense may be unlimited, with adequate units connected in tandem to accommodate any reasonable number of results to be stored. The intermediate results in the sequencing operations can be retrieved from the push-down stack 80 for combination with other sequencing calculation results.

Memory Section – FIG. 5

The memory section includes a random access memory (RAM) comprising four RAM units 25–28 and a programmable read only memory (PROM) comprising PROM units 30–33. Each of the RAMs 25–28 has a storage capacity of 1,024 bits with ten input control lines so that one bit may be read out at a time. The PROMs 30–33 have eight input control lines for outputting four bits in parallel at any time. RAMs 25–28 thus provide for the storage of 256 sixteen bit instructions. The instructions may be stored in RAMs 25–28 by use of unit 600 when NAND gate 24 is enabled. The line 23 is the memory data input line and must be enabled for flow of data to RAMs 25–28. Alternatively, 256 instructions may be stored in PROM units 30–33.

It will be noted that in FIG. 5 both the RAM units 25-28 and the PROM units 30–33 are shown in place. The RAM 25 and PROM 30 are actually connected for parallel operation and thus occupy the same position in the system. One or the other but not both would be used. The same is true of RAM 26 and PROM 31, of RAM 27 and PROM 32, and of RAM 28 and PROM 33. Thus, while redundancy is actually shown in FIG. 5, only four memory units will be employed in the embodiment here described with any desired combination of RAMs and PROMs.

The instructions storedin RAMs 25–28 may be altered by use of unit 600 in the ordinary course of operation to insert new instructions or change an existing instruction. In contrast, PROMs 30–33 are fixed and cannot be altered through use of unit 600. In the case of both RAMs 25–28 and PROMs 30–33, instructions are read out in the form of 16 one-bit control states and are read out serially by way of a gate 34.

Before describing the system in any further detail, a gross description of the desired operation will be briefly presented.

The system is sequenced through three modes, (a) wait, (b) serial I/O and (c) run.

The wait mode: The system is quiescent awaiting the next occurrence of a peak in the a.c. 60 cycle power voltage. When a peak occurs, a sync pulse if generated which initiates operation, each cycle being completed prior to the occurrence of the next peak.

The serial I/O mode: This mode is initiated by the appearance of the sync pulse. Three separate stages are involved in the serial I/O mode. During the first stage, the state of all of the input units (407, 412) on units 400, 401, FIG. 1, are read in and stored in image register 20. In the particular embodiment here described, image register 20 has 1,024 bits of storage. The input section of the image register 20 is limited to 256 bits. Therefore, as many as 256 input units can be accommodated and the states thereof read into image register 20.

During the second stage, a serial out operation takes place wherein the 512 bits centrally stored in image register 20 are read out serially. The 512 central locations are used to store flags used internally in the system and made available to any external device that may require use of such flags. No specific use is described herein but storage of such flags is part of operation and read out thereof is part of the second stage function. They are included in the serial I/O mode as an intermediate series of steps.

During the third stage, the last 256 bits in the image register 20 are read out and transmitted over cable 399, FIG. 1, for storage in units 400, 401, etc.

The information stored in the last 256 bits of register 20 is information produced during the previous cycle of operation and more particularly during the run mode of the previous cycle.

The run mode: In the run mode, instructions stored in memories 25–28 and/or 30–33 are executed by the system on the input data stored in the first 256 bits of the image register 20.

At this point it will be helpful to understand that in each of the units 400, 401, etc. there is included a parallel input serial output shift register having one bit for each input connector (411) associated with a given base, such as base 401. There is also included a serial input parallel output shift register, each having one bit for each output connector (409) associated with a given base, such as base 400. The shift registers in bases 400, 401, etc. are interconnected in tandem so that during the serial-in portion of the serial I/O mode, the states of all of the input units (407, 412) are read in serially through cable 399 into the image register 20. Thus, the bits stored in the first 256 locations in image register 20 represent the states of control elements such as switches 407 and 412, FIG. 2, at the instant that the serial I/O portion of the scan cycle takes place. At the end of the serial I/O mode, the states to which the output units, such as motors 405 and 406, are to assume are read out into the serial-in, parallel-out registers and there stored for application through control means to be applied to the output units.

With the foregoing understanding, details of the construction of the system shown in FIGS. 3–6 will now be described, following which the operation will be set out.

Controller — FIGS. 3 and 4

A NAND gate 11a in latch 11 is connected by way of line 81 to the clear input terminals of each of the units 13–15 and to the input of an RUN flip-flop 21. A pulse on line 81 is a cycle enable pulse initiating operation of the system at each peak of the power voltage.

The $\overline{Q}$ output of flip-flop 21 is connected by way of line 82 to the load input terminal of each of the units 12–15 and to the control terminal of AND gate 17. The Q output of unit 21 is connected by way of line 83 to the control terminal of an AND gate 17a. Gates 17 and 17a are connected to the inputs of a NOR gate 17b which leads by way of inverter 17c and AND gate 17d to the data input terminal of the image register 20. The data output terminal of register 20 is connected by way of line 84 to a data input terminal A of the main decoder and processor ROM 61 with the output on line 85 leading back through the data input terminal of AND gate 17a as well as to the D input terminal of a D flip-flop 86 which will be referred to herein as the active indicator or AI. The Q output terminal of AI flip-flop 86 is connected by line 87 to the data input terminal of push-down stack 80 as well as to the input terminal B or ROM 61.

Returning now to the RUN flip-flop 21, the Q output terminal is connected by way of line 83 to an enable input terminal and to a clear input terminal of each of counters 36, 37 and 38. The carry output terminal of counter 36 is connected by way of AND gate 88 to a second enable terminal of counter 37 whose carry output is connected by line 89 to a second enable terminal of counter 38. The carry output line of counter 39 is connected by way of line 52 to a second enable terminal of counter 36 and to a NAND gate 90. The carry output terminal of counter 36 is connected by way of an exclusive OR gate 91 to a second input of NAND gate 90. Exclusive OR gate 91 has a control line 92 leading from a flip-flop 93, FIG. 6, over which there is supplied a control voltage which is a time gate of length during which a word may be written into any one of the four RAMs 25–28. NAND gate 90 has a third input line 94 to which there is supplied a control voltage from a flip-flop 95, FIG. 6, to provide a SERIAL IN gate pulse. NAND gate 90 is connected to the load terminal of counter 39. The clear terminal of counter 39 and of flip-flop 21 are supplied from a NAND gate 21a.

The output lines K2, KQD, K3-K14 are lines which are included in a cable 40 leading to the sites of RAMs 25–28 and PROMs 30–33. Output line K14 from counter 38 is connected by way of inverter 96 to the clock input terminal of counter 35. The output of inverter 96 is connected by way of inverter 97 and by parallel conductor 98 to the two inputs to NAND gate 11d. The output of NAND gate 11d is a $\overline{\text{SCAN COMPLETE}}$ signal applied to NAND gate 11b to reset the latch 11 in ccondition for receipt of the next sync pulse applied to the input terminal 11e.

An oscillator 50 is connected by way of line 51 to the clock input terminal of counter 39. Oscillator 50 operates at approximately 8 mHz. It is shown in more detail in FIG. 6.

The output lines from the counter-register units 12–15 are identified as lines BO–B15, there being sixteen output bits. Lines BO–B7 are connected by way of exclusive OR gates 100–107, respectively, to the A0–A7 inputs of image register 20. The second inputs of exclusive OR gates 100–107 are connected to line 108 which, when high, inverts the adresses to register 20. The clock input terminals of each of the units 12–15 is supplied from a NAND gate 109.

States on lines B8–B11 from register 13 are employed as control-timing functions as will be described in connection with FIG. 11A.

Lines B12–B15 are connected to four input terminals E-H, respectively, of ROM 61 to apply the desired OP codes to processor 61. ROM 61 has two terminals XX which are enable terminals. The upper terminal X is connected to the output of a NAND gate 120 whose output is also connected to an enable terminal S/L (shift/load) of four bit counter 63 and, by line 121 to an inverter 122 which leads by way of a NAND gate 123 to the clock input terminal of push down stack 80. The second enable terminal X of ROM 61 is supplied from the $\overline{\text{bit 0}}$ line 124.

Data input terminal A or ROM 61 is connected by way of line 84 to the output of the image register 20. Input line D is supplied by way of the carry (CRY) line 125 leading from counter 35. B input terminal is connected by way of line 87 leading from the Q terminal of the active indicator flip-flop 86. The C input terminal is connected by way of line 127 from the output terminal of push down stack 80.

Processor ROM 61 has four output terminals Y1–Y4: (i) Terminal Y1 is connected by way of line 85 to the D input terminal of the active indicator 86 and to AND gate 17a; (ii) Terminal Y2 is connected by way of line 128 to one input of each of NAND gates 123 and 129. The output of NAND gate 129 is connected by line 130 to the clock input terminal of active indicator 86. NAND gates 123 and 129 are each supplied by the output of a NAND gate 131 whose inputs are supplied by way of a write pulse line 132 and $\overline{\text{bit 0}}$ line 124; (iii) Terminal Y3 is connected to $\overline{\text{AIQ(MCR or JUMP)}}$ line 133; and (iv) Terminal Y4 is connected by way of increment line 134 to the input pin 6 of the four bit counter 63.

ROM 62 has four output terminals Y1–Y4: (i) Terminal Y1 is connected to line 85 and thus parallels the Y1 output terminal of ROM 61; (ii) Terminal Y2 of ROM 62 is connected by way of line 135 to the data input terminal of register 12; (iii) Terminal Y3 of ROM 62 appears on memory write data line 23; and (iv) Terminal Y4 of ROM 62 is connected to the D input terminal of a flip-flop 137 which serves as a carry flip-flop for processor 62.

The Q output terminal of flip-flop 137 is connected to the D input terminal of ROM 62. The A input terminal of ROM 62 is supplied by a line 138. The B input terminal of ROM 62 is supplied by the B0 output of register 15 as above described. The C input terminal of ROM 62 is supplied by WAF line 139. The input terminals H, G and E of ROM 62 are connected from the A, B and C output terminals, respectively, of counter 63. The F input terminal of ROM 62 is supplied by the $\overline{\text{EF}}$ line 140 which results from NANDing counter outputs K4, K5 and K6 in NAND gate 136. The D output terminal of counter 63 appears on a D output line 141 which leads FIG. 5. The enable terminal P of counter 63 is supplied by way of a NAND gate 142, one terminal of which is supplied by way of ROM load line 143. The other input to NAND gate 142 is supplied by external load line 144. The external load line 144 is also connected to the enable terminal CE of image register 20.

It will be noted that the gates clock line 110 is connected to the clock input terminals of each of the registers 12–15, to the clock input terminal of the carry register 137, and to the clock input terminals of counters 36–38.

A write pulse line 132 is connected to one of the three inputs of NAND gates 109 for controlling application of clock pulses to line 110.

Data read from memories 25–28 and/or 30–33 appear on memory read data line 146 which is connected to AND gate 147. The output of AND gate 147 is connected by way of NOR gate 148 and line 149 to the input of an AND gate 150. The second input of AND gate 150 is supplied from a NAND gate 151, one input of which is supplied from the B output terminal of counter 63. The other input of NAND gate 151 is supplied from the A output terminal of counter 63 by way of an inverter 152. The output of AND gate 150 is applied to NOR gate 153 whose output is connected by way of inverter 154 to the line 138 which leads to the A input terminal of ROM 62.

The output of NAND gate 151 is also connected by way of inverter 155 to one input of an AND 156. The second input of AND gate 156 is derived from the output line 127 leading from the push down stack 80. The output of AND gate 156 is then connected to the second input of NOR gate 153.

A bit zero delay line 157 is connected to terminal 2 of counter 63.

A battery low line 158 is connected to one input of NAND gate 18 which is in the flow path of data out of the image register 20. The third input to NAND gate 18 is supplied by way of the start up line 159.

Lines A8 and A9 are connected to inputs 9 and 10 of image register 20. An image register gated write pulse (IRGWP) line 160 is connected to the R/W input terminal of image register 20.

Serial data output line 165 extends by way of an inverter 166 from NAND gate 18.

Counter output lines K3–K14 lead to FIG. 5. Register output lines B0–B11 lead to FIG. 6 along with lines K2 and KQD. Lines K0 and K1 are not used.

A NAND gate 166 supplies an I/O clock signal on line 167. The inputs to NAND gate 166 comprise a $\overline{Q}$ output of flip-flop 21 and the gated clock signal on line 110 leading from NAND gate 109.

The $\overline{Q}$ output of flip-flop 21 is connected by way of inverter 168 to the run line 169 which leads to the program panel 600.

The output of NAND gate 11b is connected by way of inverter 170 to the cycle enable line 171.

It was previously noted that external load line 144 was connected to AND gate 147. Line 144 is also connected by way of inverter 172 to one input of an AND gate 173. The output of AND gate 173 is connected to NOR gate 148. The second input of AND gate 173 is supplied by the program panel data input line 174.

FIG. 5

FIG. 5 illustrates the main memory of the system. It includes the previously identified RAMs 25–28 and PROMs 30–33. Again it will be noted that in this embodiment four memory units are employed. The four may comprise any combination of units 25 and 30, units 26 and 31, units 27 and 32, and units 28 and 33. One set of four would consist of units 25–28. A different set would consist of units 25–27 and unit 33. Another would comprise units 25, 26, 32 and 33, etc.

Counter output lines K4–K14 are connected to address input terminals of the memory units 25–28 and 30–33. Lines K3–K12 are connected to the A0–A9 inputs of units 25–28. Lines K5–K12 are connected to the A0–A7 address inputs of units 30–33. Lines K13 and K14 are connected to the A and B inputs of a data selector 175. Selector 175 has output select lines 180–183 which enable PROMs 30–33, respectively. Data selector 177 has output enable lines 185–188 which enables units 25–28, respectively. Units 175 and 177 form a single unit known as a demultiplexer. A muliplexer unit 190 has inputs A and B connected to lines K3 and K4, respectively. Each of units 30–33 has four output lines Y1–Y4. Output lines Y1–Y4 are connected parallel to a four output line bus 191 leading to inputs IC0–IC3 of multiplexer 190. A single output line 192 then leads to a flip-flop 193, the clock input terminal of which is supplied by line K2. The output line 194 from flip-flop 193 is connected to output gate 34 whose output leads to the memory read data line 146 and by way of inverter 196 to the memory read data line 197.

Data on line 146 is employed by sequencer 10. Data on line 197 is employed by program panel 600.

The data output line 198 leading from the data output terminals of all of the memory units 25-28 is connected to the second input of NAND gate 34.

FIG. 6

Figure 6:
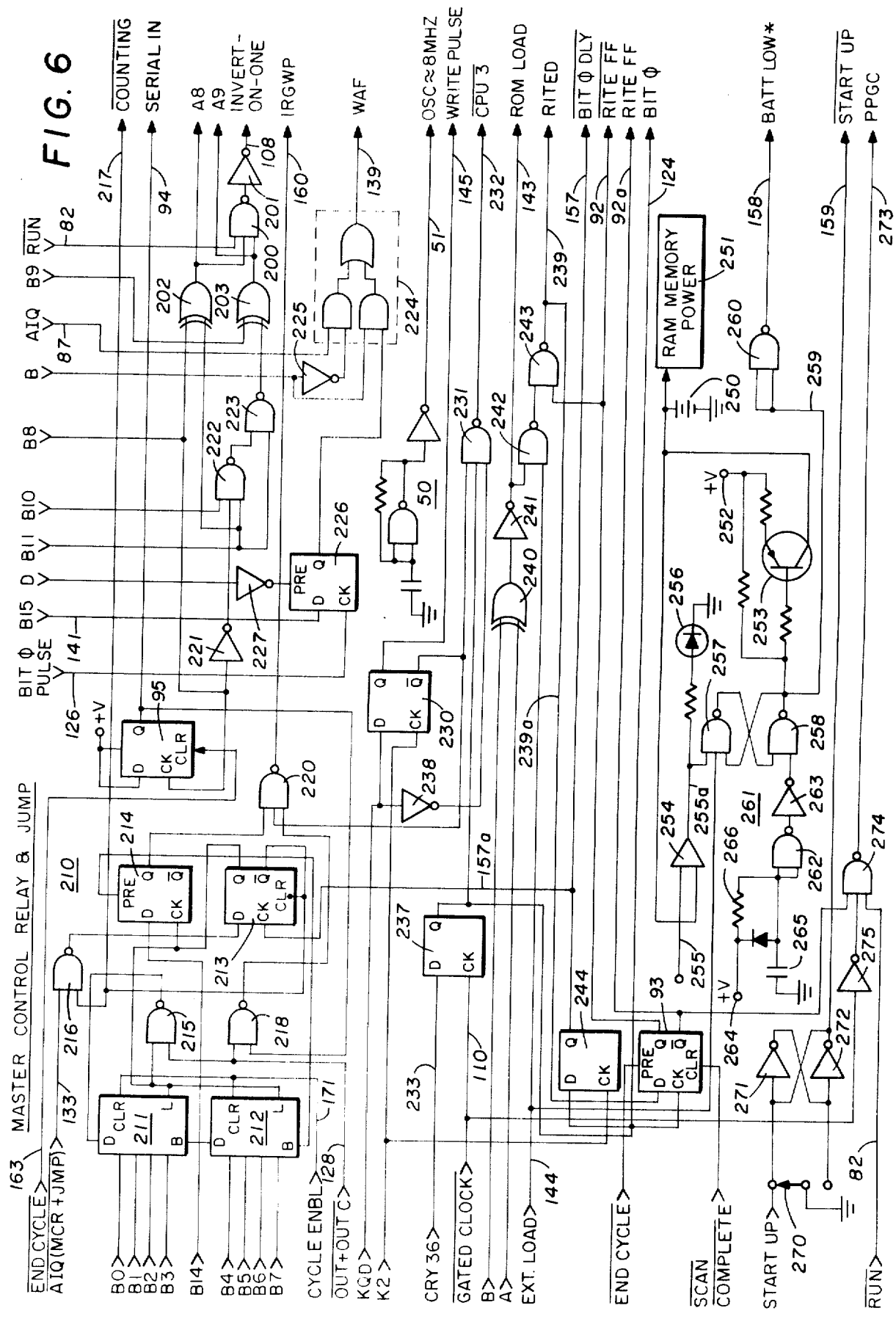
FIG. 6 illustrates certain of the control elements of the system of FIGS 3-5.

FIG. 6 illustrates logic elements employed to produce control states and timing states for operation of sequencer 10 as thus far described.

A master control relay and jump unit 210 includes two four bit counters 211 and 212. Lines B0–B3 from register 15, FIG. 4, are connected to counter 211. Lines B4–B7 are connected as inputs to counter 212.

Counters 211 and 212 are up/down counters. The output of counter 211 is connected to the down input terminal of counter 212. The output of counter 212 is connected to the clear input terminal of a flip-flop 213 and to the preset input terminal of a flip-flop 214. The Q output terminal of flip-flop 213 is connected to the clock input terminal of flip-flop 214 and to one input of a NAND gate 215 as well as to the load terminals of counters 211 and 212. The $\overline{Q}$ output terminal of flip-flop 213 is connected to one input of a NAND gate 216, the output of which is connected to the D input terminal of flip-flop 213. The $\overline{Q}$ output terminal of flip-flop 213 is also the counting output line 217. The line B14 is connected to the D input terminal of flip-flop 214. The cycle enable line 171 is connected to the clear terminals of counters 211 and 212. The sequencer output line 128 leading from the Y2 terminal of ROM 61 is connected to one input of NAND gate 215 and to one input of a NAND gate 218. The second input of NAND gate 218 is supplied from the Q output terminal of a flip-flop 95. The Q output terminal of flip-flop 95 supplies the signal on serial in line 94. The clear input terminal of flip-flop 95 is supplied by the END CYCLE signal on line 163 which is the output of NAND gate 21a, FIG. 3.

MCR + JUMP unit 210 serves to provide an output signal at the Q terminal of flip-flop 213 which controls whether or not the system is operating in a jump mode or a master control relay (MCR) mode. Flip-flop 213 indicates MCR or JMP mode whereas flip-flop 214 indicates JUMP only. If the Q terminal of flip-flop 214 is low, then the system is operating in a jump mode.

The Q output of flip-flop 214 is connected to one input of a NAND gate 220, the output of which appears on line 160. The clock input terminal of flip-flop 95 is supplied to the B8 line. The MCR + JUMP unit 210 thus is comprised of counters 211, 212, flip-flops 213, 214, flip-flop 95, and gate 220 as major components to generate the signals on lines 160 and 217.

Input line B8 is connected by way of an inverter 221 to one input of a NAND gate 222. The output of NAND gate 222 is connected to one input of NAND gate 223 which supplies the second input to exclusive OR gate 203. The second input to both of NAND gates 222 and 223 as well as exclusive OR gate 202 is supplied by way of the B11 line. The third input terminal to NAND gate 222 is supplied by way of the B10 line. The second input to the exclusive OR gate 203 is supplied by the B9 line.

A run line 82 is connected to one input of the NAND gate 200. The output of NAND gate 200 is connected by way of inverter 201 to the INVERT-ON-ONE line 108. The second input of NAND gate 200 is supplied by way of the B8 line which is connected through an exclusive OR gate 202 to NAND gate 200. The output of the exclusive OR gate 202 appears on the A8 line. The A9 line signal is produced at the output of an exclusive OR gate 203 which is also connected as the third input to NAND gate 200.

The circuit leading to WAF line 130 includes an AND/OR invert gate 224, an inverter 225, flip-flop 226 and inverter 227. This circuit serves the purpose of multiplexing the AIQ signal on line 87 and the signal on the B15 line. The B15 line is connected to the D input of flip-flop 226. The bit 0 pulse line 126 is connected to the clock terminal of flip-flop 226. The D line leading from counter 63 is connected to the input of inverter 227 and thence to preset terminal of flip-flop 226. The Q output terminal of flip-flop 226 is connected to one AND gate of unit 224. The B output terminal from counter 63 is connected to inverter 225 whose output is connected to the second AND gate of unit 224 and to the second terminal of the first AND gate of unit 224. The AIQ line 87 is connected to the second AND gate of unit 224.

A write pulse on line 145 is produced by use of flip-flop 230 which has the KQD line from counter 39 connected to the D input terminal and the K2 line from counter 39 connected to the clock terminal. The Q output terminal of flip-flop 230 is connected to the write pulse line 145.

The $\overline{Q}$ output terminal of flip-flop 230 is connected to a third input of NAND gate 220 and to one input of a NAND gate 231. The output of NAND gate 231 is the $\overline{CPU3}$ line 232 which is employed in unit 600, FIG. 1. Line 233 leading from the carry output of counter 36 is connected to the D input terminal of a flip-flop 237. The clock input terminal of flip-flop 237 is supplied by the gated clock output line 110. The Q output of flip-flop 237 is connected to the second input terminal of NAND gate 231. The third input terminal of gate 231 is supplied by the KQD output of gate 39 by way of inverter 238.

The outputs A and B from unit 63, together with the external load line 144, are employed to generate a RITED signal on line 239 and a ROM LOAD signal on line 143. Lines A and B are connected by way of an exclusive OR gate 240 and an inverter 241 to line 143. The output of inverter 241 is also connected to one input terminal of a NAND gate 242, the second input of which is the external load line 144. The output of NAND gate 242 is connected to one input of the NAND gate 243, the output of which is the RITED line 239.

The output of NAND gate 243 is connected by way of line 239a to the D input terminal of flip-flop 93. The clock input terminal of flip-flop 93 is supplied from the Q output terminal of flip-flop 237. The Q output of flip-flop 93 is the $\overline{RITEFF}$ line 92 which is connected to the second input of NAND gate 243. The $\overline{Q}$ output terminal of flip-flop 93 is the complement of the signal on line 92a.

The Q output of flip-flop 237 also appears as the $\overline{BIT\ 0}$ output line 124. The $\overline{BIT\ 0}$ signal on line 124 is provided as a BIT 0 DELAY signal on line 157 by use of a flip-flop 244. The D input terminal of flip-flop 244 is connected to the Q output terminal of flip-flop 237. The clock input terminal of flip-flop 244 is supplied by the K2 line leading from counter 39. The Q output terminal of flip-flop 244 is then connected to the output line 157 and by way of line 157a to the clock input terminal of flip-flop 213.

Provision is made in this system for anticipated failure of the power supplying the system and the operative elements controlled by unit 10. The point of concern has to do with the battery 250 which supplies power to the RAM memory power circuit represented by block 251. The RAM memory circuits are those illustrated as units 25–28 of FIG. 5. In the circuit illustrated in FIG. 6, battery 250 is charged from a power supply deriving its energy from an a.c. power line. Charging current obtained, supplied at terminal 252 passes by way of a transistor 253 to the battery 250. The circuit operates such that if the alternating current power fails and the voltage of battery 250 is below a preset level, then gate 18 of FIG. 4 is inhibited from reading out any of the data to the units 400, 401, etc. and all of the output elements in units 400 and 401 would be forced to a safe condition pending reestablishment of the alternating current power.

The voltage of battery 250 is compared in an amplifier 254 against the reference voltage on line 255. When the power fails, the voltage on line 255 goes to zero. If the voltage across battery 250 is not above a preset level represented by the voltage on line 255, then the output on line 255a goes high which turns on a light emitting diode 256 to signal low battery voltage. Line 255 is connected to one input of a NAND gate 257 which with gate 258 forms a latch. The output line 259 from latch 257, 258 is connected by way of gate 260 which leads to batt low line 158.

A power on clear circuit 261 includes a Schmitt trigger NAND gate 262 which is connected by way of inverter 263 to a second input of NAND gate 258. The input to the Schmitt trigger 262 is supplied from the terminal 264. A capacitor 265 charges up slowly when the power having failed comes back on. The charging current flows through a resistor 266. The power on clear circuit 261 forces the output terminal of gate 258 high which turns the transistor 253 off and thus prevents battery 250 from being charged momentarily or at least long enough that the comparison can be made to determine whether or not battery 250 is dead. If the battery is dead, the system will not be permitted to be in operation automatically and unattended following restoration of the power to the system.

A start up switch 270 is adapted to connect the input of an inverter 271 to ground or the input of an inverter 272 to ground depending upon its position. When the input to inverter 271 is grounded, the $\overline{START\ UP}$ line 159 is also grounded. This prevents data from passing through gate 18. When switch 270 is in the other position, grounding the input to inverter 272, line 159 is high which serves to enable gate 18.

An output line 273 is provided for transmitting a gated clock signal PPGC to unit 600, FIG. 1. Clock signal PPGC is provided at the output of a NAND gate 274 having one input connected to the $\overline{Q}$ terminal of flip-flop 93, a second terminal connected to the gated clock line 110 which passes through an inverter 275. The third input to gate 274 is the $\overline{RUN}$ line 82.

In this embodiment, processor 61 has been described as a read only memory (ROM). The particular unit employed was of the type H PROM 1-1024-5B hereinafter more fully identified in Table VII. ROM 61 was programmed in accordance with the following table.

TABLE I

PROM 61

| Hex Add. | | $Y_4$ | $Y_3$ | $Y_2$ | $Y_1$ | Hex Add. | | $Y_4$ | $Y_3$ | $Y_2$ | $Y_1$ |
|---|---|---|---|---|---|---|---|---|---|---|---|
| 0 |  | 1 | 0 | 1 | 0 | 30 |  | 1 | 1 | 0 | 0 |
| 1 |  | 1 | 0 | 1 | 0 | 31 |  | 1 | 1 | 0 | 0 |
| 2 |  | 1 | 1 | 1 | 1 | 32 |  | 1 | 1 | 0 | 1 |
| 3 |  | 1 | 1 | 1 | 1 | 33 |  | 1 | 1 | 0 | 1 |
| 4 |  | 1 | 0 | 1 | 0 | 34 |  | 1 | 1 | 0 | 0 |
| 5 |  | 1 | 0 | 1 | 0 | 35 |  | 1 | 1 | 0 | 0 |
| 6 |  | 1 | 1 | 1 | 1 | 36 |  | 1 | 1 | 0 | 1 |
| 7 | NOP | 1 | 1 | 1 | 1 | 37 | OUT | 1 | 1 | 0 | 1 |
| 8 | JMP | 1 | 0 | 1 | 0 | 38 |  | 1 | 1 | 0 | 0 |
| 9 |  | 1 | 0 | 1 | 0 | 39 |  | 1 | 1 | 0 | 0 |
| A |  | 1 | 1 | 1 | 1 | 3A |  | 1 | 1 | 0 | 1 |
| B |  | 1 | 1 | 1 | 1 | 3B |  | 1 | 1 | 0 | 1 |
| C |  | 1 | 0 | 1 | 0 | 3C |  | 1 | 1 | 0 | 0 |
| D |  | 1 | 0 | 1 | 0 | 3D |  | 1 | 1 | 0 | 0 |
| E |  | 1 | 1 | 1 | 1 | 3E |  | 1 | 1 | 0 | 1 |
| F |  | 1 | 1 | 1 | 1 | 3F |  | 1 | 1 | 0 | 1 |
| 10 |  | 1 | 1 | 1 | 0 | 40 |  | 1 | 0 | 1 | 0 |
| 11 |  | 1 | 1 | 1 | 1 | 41 |  | 1 | 0 | 1 | 0 |
| 12 |  | 1 | 1 | 1 | 0 | 42 |  | 1 | 1 | 1 | 1 |
| 13 |  | 1 | 1 | 1 | 1 | 43 |  | 1 | 1 | 1 | 1 |
| 14 |  | 1 | 1 | 1 | 0 | 44 |  | 1 | 0 | 1 | 0 |
| 15 |  | 1 | 1 | 1 | 1 | 45 |  | 1 | 0 | 1 | 0 |
| 16 |  | 1 | 1 | 1 | 0 | 46 | INV | 1 | 1 | 1 | 1 |
| 17 | LOAD | 1 | 1 | 1 | 1 | 47 | & | 1 | 1 | 1 | 1 |
| 18 | (ST) | 1 | 1 | 1 | 0 | 48 | MCR | 1 | 0 | 1 | 0 |
| 19 |  | 1 | 1 | 1 | 1 | 49 |  | 1 | 0 | 1 | 0 |
| 1A |  | 1 | 1 | 1 | 0 | 4A |  | 1 | 1 | 1 | 1 |
| 1B |  | 1 | 1 | 1 | 1 | 4B |  | 1 | 1 | 1 | 1 |
| 1C |  | 1 | 1 | 1 | 0 |  |  |  |  |  |  |
| 4C |  | 1 | 0 | 1 | 0 |  |  |  |  |  |  |
| 1D |  | 1 | 1 | 1 | 1 | 4D |  | 1 | 0 | 1 | 0 |
| 1E |  | 1 | 1 | 1 | 0 | 4E |  | 1 | 1 | 1 | 1 |
| 1F |  | 1 | 1 | 1 | 1 | 4F |  | 1 | 1 | 1 | 1 |
| 20 |  | 1 | 1 | 1 | 0 | 50 |  | 1 | 1 | 1 | 1 |
| 21 |  | 1 | 1 | 1 | 0 | 51 |  | 1 | 1 | 1 | 0 |
| 22 |  | 1 | 1 | 1 | 1 | 52 |  | 1 | 1 | 1 | 1 |
| 23 |  | 1 | 1 | 1 | 1 | 53 |  | 1 | 1 | 1 | 0 |
| 24 |  | 1 | 1 | 1 | 0 | 54 |  | 1 | 1 | 1 | 1 |
| 25 |  | 1 | 1 | 1 | 0 | 55 |  | 1 | 1 | 1 | 0 |
| 26 |  | 0 | 1 | 1 | 1 | 56 |  | 1 | 1 | 1 | 1 |
| 27 |  | 0 | 1 | 1 | 1 | 57 |  | 1 | 1 | 1 | 0 |
| 28 | CTR | 1 | 1 | 1 | 0 | 58 | LOAD | 1 | 1 | 1 | 1 |
| 29 |  | 1 | 1 | 1 | 0 | 59 | (ST) | 1 | 1 | 1 | 0 |
| 2A |  | 1 | 1 | 1 | 1 | 5A |  | 1 | 1 | 1 | 1 |
| 2B |  | 1 | 1 | 1 | 1 | 5B |  | 1 | 1 | 1 | 0 |
| 2C |  | 1 | 1 | 1 | 0 | 5C |  | 1 | 1 | 1 | 1 |
| 2D |  | 1 | 1 | 1 | 0 | 5D |  | 1 | 1 | 1 | 0 |
| 2E |  | 0 | 1 | 1 | 1 | 5E |  | 1 | 1 | 1 | 1 |
| 2F |  | 0 | 1 | 1 | 1 | 5F |  | 1 | 1 | 1 | 0 |
| 60 |  | 1 | 1 | 1 | 0 | 90 |  | 1 | 1 | 1 | 0 |
| 61 |  | 1 | 1 | 1 | 0 | 91 |  | 1 | 1 | 1 | 0 |
| 62 |  | 1 | 1 | 1 | 1 | 92 |  | 1 | 1 | 1 | 0 |
| 63 |  | 1 | 1 | 1 | 1 | 93 |  | 1 | 1 | 1 | 0 |
| 64 |  | 1 | 1 | 1 | 0 | 94 |  | 1 | 1 | 1 | 0 |
| 65 |  | 1 | 1 | 1 | 0 | 95 |  | 1 | 1 | 1 | 0 |
| 66 |  | 1 | 1 | 1 | 1 | 96 |  | 1 | 1 | 1 | 1 |
| 67 |  | 1 | 1 | 1 | 1 | 97 |  | 1 | 1 | 1 | 1 |
| 68 | TMR | 1 | 1 | 1 | 0 | 98 | AT | 1 | 1 | 1 | 0 |
| 69 |  | 1 | 1 | 1 | 1 | 99 |  | 1 | 1 | 1 | 0 |
| 6A |  | 1 | 1 | 1 | 0 | 9A |  | 1 | 1 | 1 | 0 |
| 6B |  | 1 | 1 | 1 | 1 | 9B |  | 1 | 1 | 1 | 0 |
| 6C |  | 1 | 1 | 1 | 0 | 9C |  | 1 | 1 | 1 | 0 |
| 6D |  | 1 | 1 | 1 | 1 | 9D |  | 1 | 1 | 1 | 0 |
| 6E |  | 0 | 1 | 1 | 1 | 9E |  | 1 | 1 | 1 | 1 |
| 6F |  | 0 | 1 | 1 | 1 | 9F |  | 1 | 1 | 1 | 1 |
| 70 |  | 1 | 1 | 0 | 1 | A0 |  | 1 | 1 | 1 | 0 |
| 71 |  | 1 | 1 | 0 | 1 | A1 |  | 1 | 1 | 1 | 1 |
| 72 |  | 1 | 1 | 0 | 0 | A2 |  | 1 | 1 | 1 | 1 |
| 73 |  | 1 | 1 | 0 | 0 | A3 |  | 1 | 1 | 1 | 1 |
| 74 |  | 1 | 1 | 0 | 1 | A4 |  | 1 | 1 | 1 | 0 |
| 75 |  | 1 | 1 | 0 | 1 | A5 |  | 1 | 1 | 1 | 1 |
| 76 |  | 1 | 1 | 0 | 0 | A6 |  | 1 | 1 | 1 | 1 |
| 77 |  | 1 | 1 | 0 | 0 | A7 |  | 1 | 1 | 1 | 1 |
| 78 | OUTC | 1 | 1 | 0 | 1 | A8 | OB | 1 | 1 | 1 | 0 |
| 79 |  | 1 | 1 | 0 | 1 | A9 |  | 1 | 1 | 1 | 1 |
| 7A |  | 1 | 1 | 0 | 0 | AA |  | 1 | 1 | 1 | 1 |
| 7B |  | 1 | 1 | 0 | 0 | AB |  | 1 | 1 | 1 | 1 |
| 7C |  | 1 | 1 | 0 | 1 | AC |  | 1 | 1 | 1 | 0 |
| 7D |  | 1 | 1 | 0 | 1 | AD |  | 1 | 1 | 1 | 1 |
| 7E |  | 1 | 1 | 0 | 0 | AE |  | 1 | 1 | 1 | 1 |
| 7F |  | 1 | 1 | 0 | 0 | AF |  | 1 | 1 | 1 | 1 |
| 80 |  | 1 | 1 | 1 | 0 | B0 |  | 1 | 1 | 1 | 0 |
| 81 | AH | 1 | 1 | 1 | 0 | B1 | OT | 1 | 1 | 1 | 0 |
| 82 |  | 1 | 1 | 1 | 1 | B2 |  | 1 | 1 | 1 | 1 |

TABLE I-continued

PROM 61

| Hex Add. | | $Y_4$ | $Y_3$ | $Y_2$ | $Y_1$ | Hex Add. | | $Y_4$ | $Y_3$ | $Y_2$ | $Y_1$ |
|---|---|---|---|---|---|---|---|---|---|---|---|
| 83 |  | 1 | 1 | 1 | 1 | B3 |  | 1 | 1 | 1 | 1 |
| 84 |  | 1 | 1 | 1 | 0 | B4 |  | 1 | 1 | 1 | 1 |
| 85 |  | 1 | 1 | 1 | 0 | B5 |  | 1 | 1 | 1 | 1 |
| 86 |  | 1 | 1 | 1 | 0 | B6 |  | 1 | 1 | 1 | 1 |
| 87 |  | 1 | 1 | 1 | 1 | B7 |  | 1 | 1 | 1 | 1 |
| 88 |  | 1 | 1 | 1 | 0 | B8 |  | 1 | 1 | 1 | 0 |
| 89 | AB | 1 | 1 | 1 | 0 | B9 | OT | 1 | 1 | 1 | 0 |
| 8A |  | 1 | 1 | 1 | 0 | BA |  | 1 | 1 | 1 | 1 |
| 8B |  | 1 | 1 | 1 | 1 | BB |  | 1 | 1 | 1 | 1 |
| 8C |  | 1 | 1 | 1 | 0 | BC |  | 1 | 1 | 1 | 1 |
| 8D |  | 1 | 1 | 1 | 0 | BD |  | 1 | 1 | 1 | 1 |
| 8E |  | 1 | 1 | 1 | 0 | BE |  | 1 | 1 | 1 | 1 |
| 8F |  | 1 | 1 | 1 | 1 | BF |  | 1 | 1 | 1 | 1 |
| C0 |  | 1 | 1 | 1 | 0 | E0 |  | 1 | 1 | 1 | 1 |
| C1 |  | 1 | 1 | 1 | 0 | E1 |  | 1 | 1 | 1 | 0 |
| C2 |  | 1 | 1 | 1 | 1 | E2 |  | 1 | 1 | 1 | 1 |
| C3 |  | 1 | 1 | 1 | 0 | E3 |  | 1 | 1 | 1 | 1 |
| C4 |  | 1 | 1 | 1 | 0 | E4 |  | 1 | 1 | 1 | 1 |
| C5 |  | 1 | 1 | 1 | 0 | E5 |  | 1 | 1 | 1 | 0 |
| C6 |  | 1 | 1 | 1 | 1 | E6 |  | 1 | 1 | 1 | 1 |
| C7 |  | 1 | 1 | 1 | 0 | E7 |  | 1 | 1 | 1 | 1 |
| C8 | ABC | 1 | 1 | 1 | 0 | E8 | OBC | 1 | 1 | 1 | 1 |
| C9 |  | 1 | 1 | 1 | 0 | E9 |  | 1 | 1 | 1 | 0 |
| CA |  | 1 | 1 | 1 | 1 | EA |  | 1 | 1 | 1 | 1 |
| CB |  | 1 | 1 | 1 | 0 | EB |  | 1 | 1 | 1 | 1 |
| CC |  | 1 | 1 | 1 | 0 | EC |  | 1 | 1 | 1 | 1 |
| CD |  | 1 | 1 | 1 | 0 | ED |  | 1 | 1 | 1 | 0 |
| CE |  | 1 | 1 | 1 | 1 | EE |  | 1 | 1 | 1 | 1 |
| CF |  | 1 | 1 | 1 | 0 | EF |  | 1 | 1 | 1 | 1 |
| D0 |  | 1 | 1 | 1 | 0 | F0 |  | 1 | 1 | 1 | 1 |
| D1 |  | 1 | 1 | 1 | 0 | F1 |  | 1 | 1 | 1 | 1 |
| D2 |  | 1 | 1 | 1 | 1 | F2 |  | 1 | 1 | 1 | 1 |
| D3 |  | 1 | 1 | 1 | 1 | F3 |  | 1 | 1 | 1 | 1 |
| D4 |  | 1 | 1 | 1 | 0 | F4 |  | 1 | 1 | 1 | 0 |
| D5 |  | 1 | 1 | 1 | 0 | F5 |  | 1 | 1 | 1 | 0 |
| D6 |  | 1 | 1 | 1 | 0 | F6 |  | 1 | 1 | 1 | 1 |
| D7 |  | 1 | 1 | 1 | 0 | F7 |  | 1 | 1 | 1 | 1 |
| D8 | ATC | 1 | 1 | 1 | 0 | F8 | OTC | 1 | 1 | 1 | 1 |
| D9 |  | 1 | 1 | 1 | 0 | F9 |  | 1 | 1 | 1 | 1 |
| DA |  | 1 | 1 | 1 | 1 | FA |  | 1 | 1 | 1 | 1 |
| DB |  | 1 | 1 | 1 | 1 | FB |  | 1 | 1 | 1 | 1 |
| DC |  | 1 | 1 | 1 | 0 | FC |  | 1 | 1 | 1 | 0 |
| DD |  | 1 | 1 | 1 | 0 | FD |  | 1 | 1 | 1 | 0 |
| DE |  | 1 | 1 | 1 | 0 | FE |  | 1 | 1 | 1 | 1 |
| DF |  | 1 | 1 | 1 | 0 | FF |  | 1 | 1 | 1 | 1 |

Time control 62 also is a ROM. It was of the type H PROM 1-1024-5B hereinafter more fully identified in Table VII. ROM 62 was programmed in accordance with Table II.

TABLE II

PROM 62

| Hex Add. | $Y_4$ | $Y_3$ | $Y_2$ | $Y_1$ | Hex Add. | $Y_4$ | $Y_3$ | $Y_2$ | $Y_1$ |
|---|---|---|---|---|---|---|---|---|---|
| 0 | 1 | 0 | 0 | 0 | 20 | 1 | 0 | 0 | 0 |
| 1 | 1 | 0 | 1 | 0 | 21 | 1 | 0 | 1 | 0 |
| 2 | 1 | 1 | 0 | 0 | 22 | 1 | 1 | 0 | 0 |
| 3 | 1 | 1 | 1 | 0 | 23 | 1 | 1 | 1 | 0 |
| 4 | 1 | 0 | 0 | 1 | 24 | 1 | 0 | 0 | 1 |
| 5 | 1 | 0 | 1 | 1 | 25 | 1 | 0 | 1 | 1 |
| 6 | 1 | 1 | 0 | 1 | 26 | 1 | 1 | 0 | 1 |
| 7 | 1 | 1 | 1 | 1 | 27 | 1 | 1 | 1 | 1 |
| 8 | 1 | 0 | 0 | 0 | 28 | 1 | 0 | 0 | 0 |
| 9 | 1 | 0 | 1 | 0 | 29 | 1 | 0 | 1 | 0 |
| A | 1 | 1 | 0 | 0 | 2A | 1 | 1 | 0 | 0 |
| B | 1 | 1 | 1 | 0 | 2B | 1 | 1 | 1 | 0 |
| C | 1 | 0 | 0 | 1 | 2C | 1 | 0 | 0 | 1 |
| D | 1 | 0 | 1 | 1 | 2D | 1 | 0 | 1 | 1 |
| E | 1 | 1 | 0 | 1 | 2E | 1 | 1 | 0 | 1 |
| F | 1 | 1 | 1 | 1 | 2F | 1 | 1 | 1 | 1 |
| 10 | 1 | 0 | 0 | 0 | 30 | 1 | 0 | 0 | 0 |
| 11 | 1 | 0 | 1 | 0 | 31 | 1 | 0 | 1 | 0 |
| 12 | 1 | 1 | 0 | 0 | 32 | 1 | 1 | 0 | 0 |
| 13 | 1 | 1 | 1 | 0 | 33 | 1 | 1 | 1 | 0 |
| 14 | 1 | 0 | 0 | 1 | 34 | 1 | 0 | 0 | 1 |
| 15 | 1 | 0 | 1 | 1 | 35 | 1 | 0 | 1 | 1 |
| 16 | 1 | 1 | 0 | 1 | 36 | 1 | 1 | 0 | 1 |
| 17 | 1 | 1 | 1 | 1 | 37 | 1 | 1 | 1 | 1 |
| 18 | 1 | 0 | 0 | 0 | 38 | 1 | 0 | 0 | 0 |
| 19 | 1 | 0 | 1 | 0 | 39 | 1 | 0 | 1 | 0 |
| 1A | 1 | 1 | 0 | 0 | 3A | 1 | 1 | 0 | 0 |

TABLE II-continued

| Hex Add. | Y4 | Outputs Y3 | Y2 | Y1 | Hex Add. | Y4 | Outputs Y3 | Y2 | Y1 |
|---|---|---|---|---|---|---|---|---|---|
| PROM 62 | | | | | | | | | |
| 1B | 1 | 1 | 1 | 0 | 3B | 1 | 1 | 1 | 0 |
| 1C | 1 | 0 | 0 | 1 | 3C | 1 | 0 | 0 | 1 |
| 1D | 1 | 0 | 1 | 1 | 3D | 1 | 0 | 1 | 1 |
| 1E | 1 | 1 | 0 | 1 | 3E | 1 | 1 | 0 | 1 |
| 1F | 1 | 1 | 1 | 1 | 3F | 1 | 1 | 1 | 1 |

State 0

| Hex Add. | Y4 | Y3 | Y2 | Y1 | Hex Add. | Y4 | Y3 | Y2 | Y1 |
|---|---|---|---|---|---|---|---|---|---|
| 40 | 0 | 0 | 0 | 0 | 60 | 0 | 0 | 0 | 0 |
| 41 | 0 | 0 | 0 | 0 | 61 | 0 | 0 | 0 | 0 |
| 42 | 0 | 1 | 0 | 0 | 62 | 0 | 1 | 0 | 0 |
| 43 | 0 | 1 | 0 | 0 | 63 | 0 | 1 | 0 | 0 |
| 44 | 0 | 0 | 0 | 1 | 64 | 0 | 0 | 0 | 1 |
| 45 | 0 | 0 | 1 | 1 | 65 | 1 | 0 | 1 | 1 |
| 46 | 0 | 1 | 0 | 1 | 66 | 0 | 1 | 0 | 1 |
| 47 | 0 | 1 | 1 | 1 | 67 | 0 | 1 | 1 | 1 |
| 48 | 1 | 0 | 0 | 0 | 68 | 0 | 0 | 0 | 0 |
| 49 | 1 | 0 | 0 | 0 | 69 | 0 | 0 | 0 | 0 |
| 4A | 1 | 1 | 0 | 0 | 6A | 0 | 1 | 0 | 0 |
| 4B | 1 | 1 | 0 | 0 | 6B | 0 | 1 | 0 | 0 |
| 4C | 1 | 0 | 0 | 1 | 6C | 1 | 0 | 0 | 1 |
| 4D | 1 | 0 | 1 | 1 | 6D | 1 | 0 | 1 | 1 |
| 4E | 1 | 1 | 0 | 1 | 6E | 0 | 1 | 0 | 1 |
| 4F | 1 | 1 | 1 | 1 | 6F | 1 | 1 | 1 | 1 |
| 50 | 0 | 0 | 0 | 0 | 70 | 0 | 0 | 0 | 0 |
| 51 | 0 | 0 | 0 | 0 | 71 | 0 | 0 | 0 | 0 |
| 52 | 0 | 1 | 1 | 0 | 72 | 0 | 1 | 1 | 0 |
| 53 | 0 | 1 | 1 | 0 | 73 | 0 | 1 | 1 | 0 |
| 54 | 0 | 0 | 0 | 1 | 74 | 0 | 0 | 0 | 1 |
| 55 | 0 | 0 | 1 | 1 | 75 | 0 | 0 | 1 | 1 |
| 56 | 0 | 1 | 0 | 1 | 76 | 0 | 1 | 0 | 1 |
| 57 | 0 | 1 | 1 | 1 | 77 | 0 | 1 | 1 | 1 |
| 58 | 1 | 0 | 0 | 0 | 78 | 0 | 0 | 0 | 0 |
| 59 | 1 | 0 | 0 | 0 | 79 | 0 | 0 | 0 | 0 |
| 5A | 1 | 1 | 0 | 0 | 7A | 0 | 1 | 1 | 0 |
| 5B | 1 | 1 | 1 | 0 | 7B | 0 | 1 | 1 | 0 |
| 5C | 1 | 0 | 0 | 1 | 7C | 1 | 0 | 0 | 1 |
| 5D | 1 | 0 | 1 | 1 | 7D | 0 | 0 | 1 | 1 |
| 5E | 1 | 1 | 0 | 1 | 7E | 1 | 1 | 0 | 1 |
| 5F | 1 | 1 | 1 | 1 | 7F | 0 | 1 | 1 | 1 |

STATE 1

| Hex Add. | Y4 | Y3 | Y2 | Y1 | Hex Add. | Y4 | Y3 | Y2 | Y1 |
|---|---|---|---|---|---|---|---|---|---|
| 80 | 1 | 0 | 1 | 0 | A0 | 1 | 0 | 1 | 0 |
| 81 | 1 | 1 | 1 | 0 | A1 | 1 | 0 | 1 | 0 |
| 82 | 1 | 0 | 1 | 0 | A2 | 1 | 1 | 1 | 0 |
| 83 | 1 | 1 | 1 | 0 | A3 | 1 | 1 | 1 | 0 |
| 84 | 1 | 0 | 1 | 0 | A4 | 1 | 1 | 1 | 0 |
| 85 | 1 | 1 | 1 | 0 | A5 | 1 | 1 | 1 | 1 |
| 86 | 1 | 0 | 1 | 0 | A6 | 0 | 0 | 0 | 0 |
| 87 | 1 | 1 | 1 | 0 | A7 | 0 | 0 | 1 | 1 |
| 88 | 1 | 0 | 1 | 1 | A8 | 1 | 0 | 1 | 1 |
| 89 | 1 | 1 | 1 | 1 | A9 | 1 | 0 | 1 | 1 |
| 8A | 1 | 0 | 1 | 1 | AA | 1 | 1 | 1 | 1 |
| 8B | 1 | 1 | 1 | 1 | AB | 1 | 1 | 1 | 1 |
| 8C | 1 | 0 | 1 | 1 | AC | 1 | 0 | 0 | 1 |
| 8D | 1 | 1 | 1 | 1 | AD | 1 | 0 | 1 | 1 |
| 8E | 1 | 0 | 1 | 1 | AE | 1 | 1 | 0 | 1 |
| 8F | 1 | 1 | 1 | 1 | AF | 1 | 1 | 1 | 1 |
| 90 | 1 | 0 | 1 | 0 | B0 | 1 | 0 | 1 | 0 |
| 91 | 1 | 0 | 1 | 0 | B1 | 1 | 0 | 1 | 0 |
| 92 | 1 | 0 | 1 | 0 | B2 | 1 | 1 | 1 | 0 |
| 93 | 1 | 0 | 1 | 0 | B3 | 1 | 1 | 1 | 0 |
| 94 | 1 | 0 | 1 | 0 | B4 | 0 | 1 | 1 | 0 |
| 95 | 1 | 0 | 1 | 0 | B5 | 0 | 1 | 1 | 0 |
| 96 | 1 | 0 | 1 | 0 | B6 | 1 | 0 | 1 | 0 |
| 97 | 1 | 0 | 1 | 0 | B7 | 1 | 0 | 1 | 0 |
| 98 | 1 | 0 | 1 | 1 | B8 | 1 | 0 | 1 | 1 |
| 99 | 1 | 0 | 1 | 1 | B9 | 1 | 0 | 1 | 1 |
| 9A | 1 | 0 | 1 | 1 | BA | 1 | 1 | 1 | 1 |
| 9B | 1 | 0 | 1 | 1 | BB | 1 | 1 | 1 | 1 |
| 9C | 1 | 0 | 1 | 1 | BC | 1 | 0 | 1 | 1 |
| 9D | 1 | 0 | 1 | 1 | BD | 1 | 0 | 1 | 1 |
| 9E | 1 | 0 | 1 | 1 | BE | 1 | 1 | 1 | 1 |
| 9F | 1 | 0 | 1 | 1 | BF | 1 | 1 | 1 | 1 |

STATE 2

| Hex Add. | Y4 | Y3 | Y2 | Y1 | Hex Add. | Y4 | Y3 | Y2 | Y1 |
|---|---|---|---|---|---|---|---|---|---|
| C0 | 1 | 0 | 0 | 1 | E0 | 1 | 0 | 0 | 1 |
| C1 | 1 | 0 | 1 | 1 | E1 | 1 | 0 | 1 | 1 |
| C2 | 1 | 1 | 0 | 1 | E2 | 1 | 1 | 0 | 1 |
| C3 | 1 | 1 | 1 | 1 | E3 | 1 | 1 | 1 | 1 |
| C4 | 1 | 0 | 0 | 1 | E4 | 1 | 0 | 0 | 1 |
| C5 | 1 | 0 | 1 | 1 | E5 | 1 | 0 | 1 | 1 |
| C6 | 1 | 1 | 0 | 1 | E6 | 1 | 1 | 0 | 1 |
| C7 | 1 | 1 | 1 | 1 | E7 | 1 | 1 | 1 | 1 |
| C8 | 1 | 0 | 0 | 1 | E8 | 1 | 0 | 0 | 1 |
| C9 | 1 | 0 | 1 | 1 | E9 | 1 | 0 | 1 | 1 |
| CA | 1 | 1 | 0 | 1 | EA | 1 | 1 | 0 | 1 |
| CB | 1 | 1 | 1 | 1 | EB | 1 | 1 | 1 | 1 |
| CC | 1 | 0 | 0 | 1 | EC | 1 | 0 | 0 | 1 |
| CD | 1 | 0 | 1 | 1 | ED | 1 | 0 | 1 | 1 |
| CE | 1 | 1 | 0 | 1 | EE | 1 | 1 | 0 | 1 |
| CF | 1 | 1 | 1 | 1 | EF | 1 | 1 | 1 | 1 |
| D0 | 1 | 0 | 0 | 1 | F0 | 1 | 0 | 0 | 1 |
| D1 | 1 | 0 | 1 | 1 | F1 | 1 | 0 | 1 | 1 |
| D2 | 1 | 1 | 0 | 1 | F2 | 1 | 1 | 0 | 1 |
| D3 | 1 | 1 | 1 | 1 | F3 | 1 | 1 | 1 | 1 |
| D4 | 1 | 0 | 0 | 1 | F4 | 1 | 0 | 0 | 1 |
| D5 | 1 | 0 | 1 | 1 | F5 | 1 | 0 | 1 | 1 |
| D6 | 1 | 1 | 0 | 1 | F6 | 1 | 1 | 0 | 1 |
| D7 | 1 | 1 | 1 | 1 | F7 | 1 | 1 | 1 | 1 |
| D8 | 1 | 0 | 0 | 1 | F8 | 1 | 0 | 0 | 1 |
| D9 | 1 | 0 | 1 | 1 | F9 | 1 | 0 | 1 | 1 |
| DA | 1 | 1 | 0 | 1 | FA | 1 | 1 | 0 | 1 |
| DB | 1 | 1 | 1 | 1 | FB | 1 | 1 | 1 | 1 |
| DC | 1 | 0 | 0 | 1 | FC | 1 | 0 | 0 | 1 |
| DD | 1 | 0 | 1 | 1 | FD | 1 | 0 | 1 | 1 |
| DE | 1 | 1 | 0 | 1 | FE | 1 | 1 | 0 | 1 |
| DF | 1 | 1 | 1 | 1 | FF | 1 | 1 | 1 | 1 |

STATE 3

In the foregoing description FIGS. 3–6 relate to the contents of the controller 10, FIG. 1. Controller 10 may be made to respond to input devices, such as switches 407 and 412, FIG. 1, to control output devices, such as motors 405 and 406. The unique requirements that are to be satisfied through the use of controller 10 are specified by conventional means such as the ladder diagram of FIG. 2. Suitable preset states are entered into memory in controller 10 from the unit 600 when connected as illustrated in FIG. 1.

PROGRAMMER — FIGS. 1, 1A, 1B 7–10

Unit 600 FIG. 1 is a small portable keyboard input unit. Four sets of keys are included. The first set, 600c, is an 11 key set having the numerals 0–9 and a CLR (clear) button. The second set, 600d, is a four key set identified as INS (insert), WRT (write), INC (increment), and READ.

The third set, 600e, is a four key set, three of which are used, namely IN-X, OUT-Y and CR (control relay).

The fourth set, 600f, is an eight key set including ST (start of store term), CTR (counter), TMR (timer), MCR (master control relay), OUT (output), INV (invert or not), OR, and AND.

Associated with the keyboard is an array 600g of neon seven segment numerical displays, such as conventionally provided in hand calculators.

Light emitting diodes 600h are provided with one such indicator for each of the keys in the set 600f. Light emitting diodes 600j are provided, one for each of the keys X, Y, and CR and one for the none key location AI.

Programmer 600, as shown in FIG. 1, serves to provide for operation in any selected one of five different modes. A mode is selected by depressing any one of the four buttons in set 600d or the clear (CLR) button of set 600c. Depression of the clear button in set 600c serves to clear registers and storage units hereinafter identified preparatory to performing any one of the functions in set 600d.

In the read mode, any instruction in the memory of FIG. 5 may be read. This may be done by first entering through the keyboard 600c the address in memory of the instruction which is to be read, i.e., from 0 through 255. Depression of the read key thereafter causes the instruction to appear in the display 600g and further causes the appropriate LED elements in sets 600*h* and 600*j* to be illuminated.

In the increment mode, any address that has been entered into the unit 600 by way of its keyboard and has not been cleared will be incremented by a factor of one upon depression of the INC button and clears the left portion of the display and the OP code command. For example, if the button CLR in set 600*c* is depressed, followed by depressing the INC button of set 600*d*, the address then effective in the machine will be address No. 1, but if the address presented by display 600*g* is 250, it will be incremented to 251.

Memory addresses effective at a given time are displayed on the right hand four digits of display 600*g*.

In the write mode, any new instruction desired can be written into memory. If an instruction previously was placed in memory at the desired location, the write mode causes the new instruction to be written over the previous instruction.

In the insert function, a new instruction can be inserted at any point in memory with every subsequent instruction stored in memory being shifted one memory location higher upon depression of the INS button. For example, in terms of the ladder diagram of FIG. 2, if the ladder rung including motor 405 occupied memory locations 100, 101 and 102 and it is desired to insert into memory beginning at location 100 the rung including motor 406, then the following operations would be carried out, using programmer 600.

Step 1: depress clear button.
Step 2: enter the address, i.e., depress buttons 100.
Step 3: depress ST (start-store) and X (in) buttons.
Step 4: since switch 407 occupies the I/O address No. 9, depress numeral 9 of set 600*c*.
Step 5: depress INS button (insert) of set 600*d*.

This establishes in memory location 100 the switch 407.

Step 6: depress button INC.
Step 7: depress button AND of set 600*f*.
Step 8: depress key X of set 600*e*.
Step 9: since switch 412 occupies I/O address 16, depress keys 1 and 6 of set 600*c*.
Step 10: depress key INS of set 600*d*.

This completes insertion of element 412 into memory location 101 together with its relation to switch 407.

Step 11: depress button INC of set 600*d*.
Step 12: depress button OUT of set 600*f*.
Step 13: depress button Y of set 600*e*.
Step 14: since motor 406 occupies I/O address 8, depress numeral 8 of set 600*c*.
Step 15: depress button INS of set 600*d*.

This completes entry of the motor 406 into memory location 102 together with its relation to switches 407 and 412.

The elements of the second rung previously occupied memory addresses 100, 101 and 102. Entry of switch 407 into memory shifts all elements in memory up one memory address. The same is true upon insertion of the switch 412 and upon insertion of the motor 406. Thus, the elements of the rung involving motor 405 occupy new memory locations 103, 104 and 105. The push buttons illustrated in FIG. 1 actuate switches connected in the circuit arrangement illustrated in FIGS. 1A and 1B. In FIG. 1A, eight lines, $\overline{M0-M7}$, lead to the keyboard. Four lines KBD2, KBD3, KBD6 and KBD7 lead from the keyboard. The push button switches are connected in the resulting matrix to provide coded outputs on the four lines leading from the keyboard. All of the switches in set 600*c* (except switch CLR), set 600*e* and set 600*f* are involved in the *x–y* matrix of FIG. 1A as indicated by the legends therein. Depression of the zero switch on keyboard 600*c*, FIG. 1, established continuity between line M0 and line KBD2 of FIG. 1A. It will be noted that the switches MCR and INV provide the same function, i.e., the closure of each causes continuity to be established between input line M4 and output line KBD7.

Figure 7:
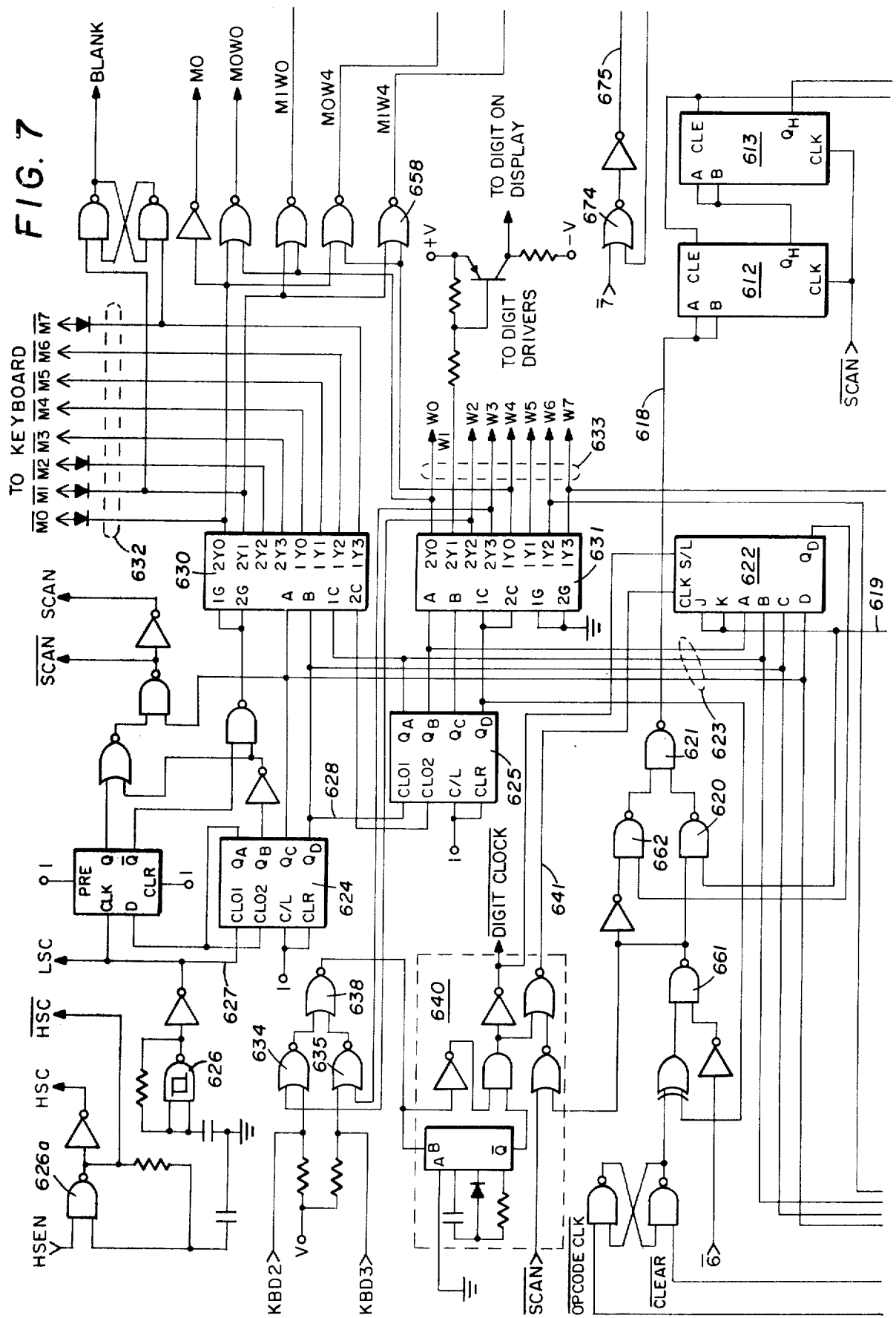
FIGS. 7-10 illustrate details of a programming unit employed herein.
Figure 8:
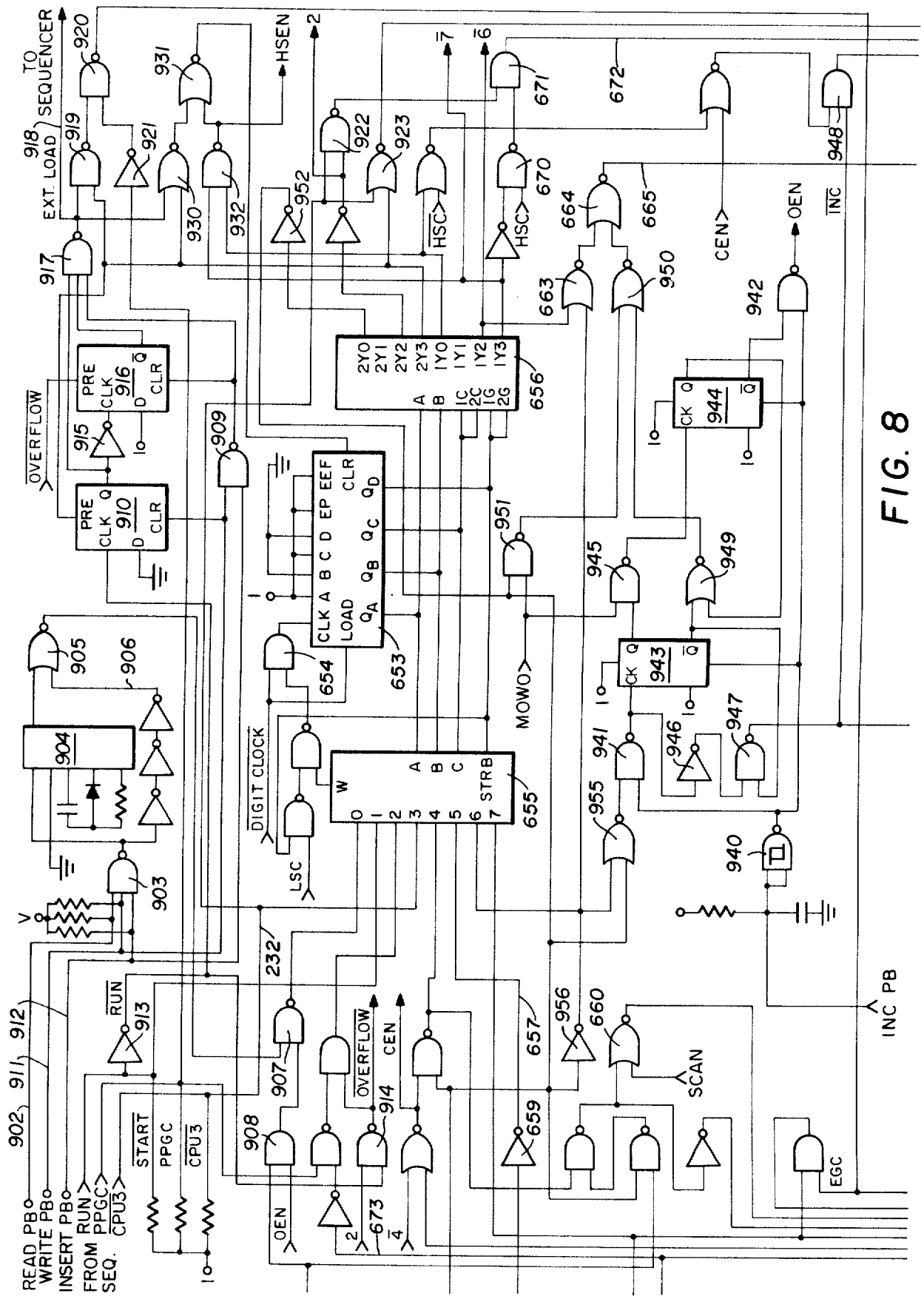

In FIG. 7, unit 600 has lines $\overline{M0-M7}$ which lead to the keyboard in the manner illustrated in FIG. 1A. The lines KBD2 and KBD3, FIG. 6, and linens KBD6 and KBD7, FIG. 9, lead from the keyboard.

The circuit of FIGS. 7–10 includes two primary data loops responsive to commands entered by way of the keyboard. The two data loops will first be generally described before discussing further the utilization of the keyboard arrangement of FIGS. 1, 1A and 1B.

Figure 9:
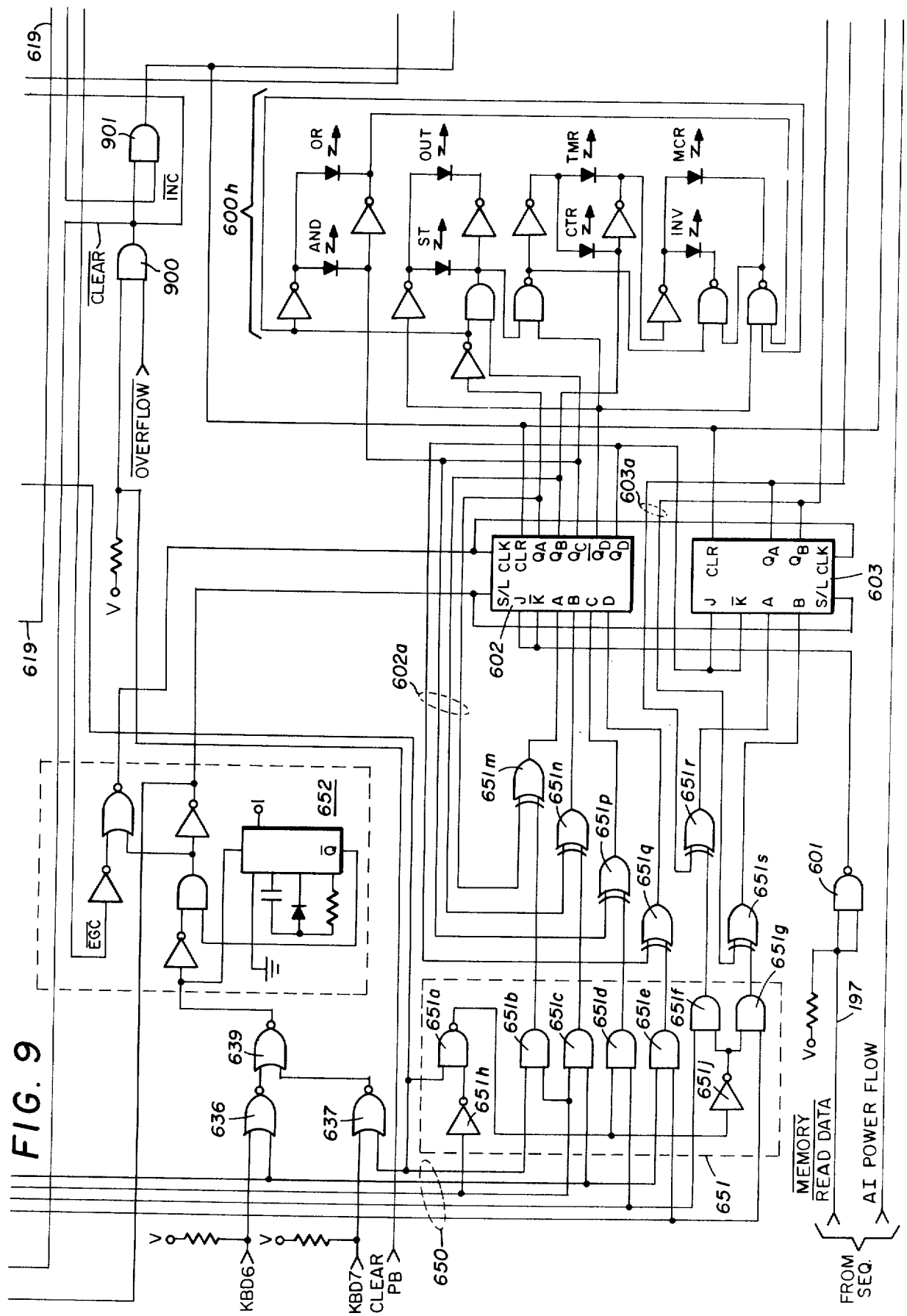
Figure 10:
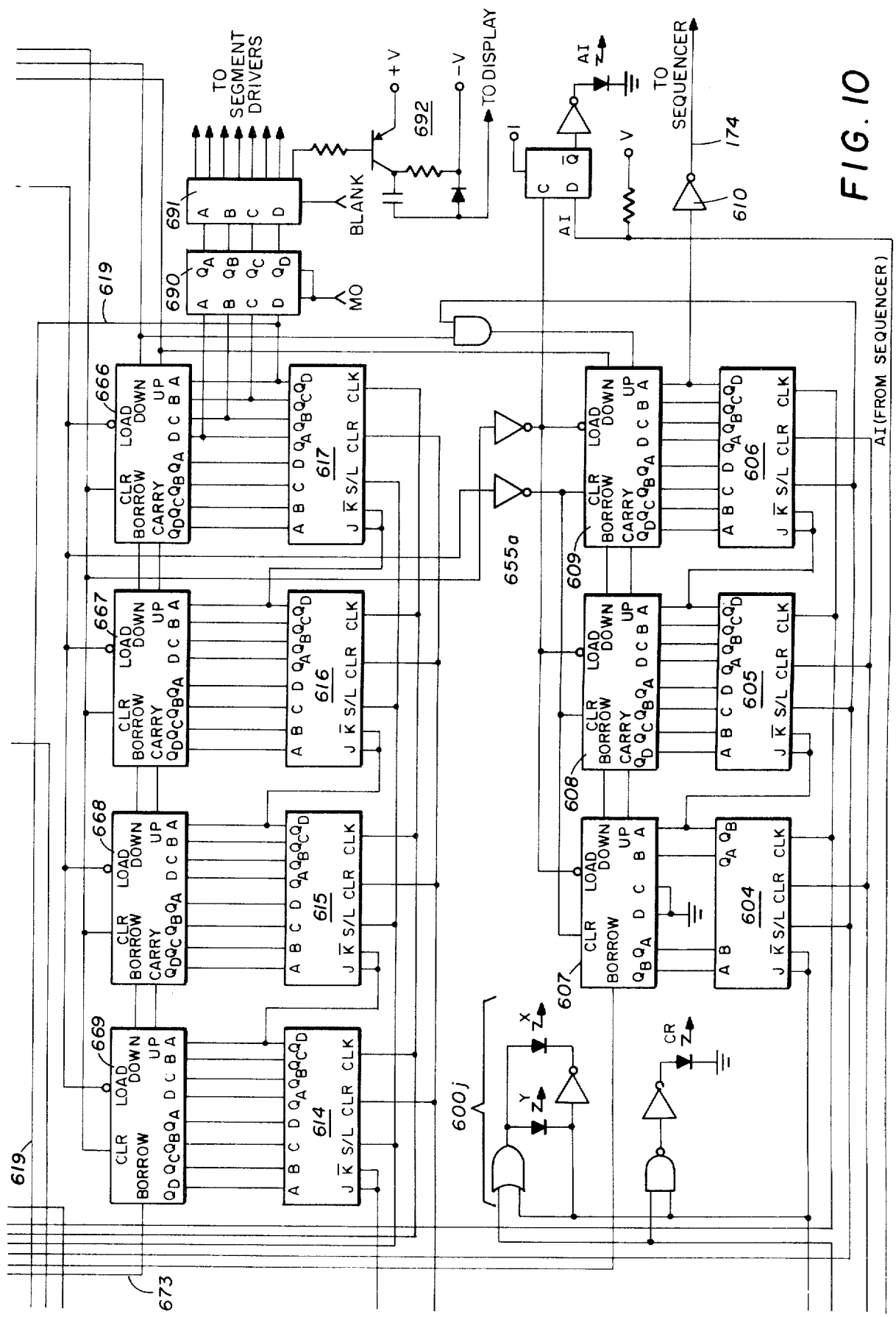

The first data loop leads from the sequencer 10, FIGS. 3 and 4, through a Schmitt trigger 601, FIG. 9, and includes shift registers 602–606, FIGS. 9 and 10. Operating with the shift registers 604–606 are binary up/down counters 607–609, respectively.

The output of the first data loop passes by way of inverter 610 to line 174 which leads back to sequencer 10. Any signals or data type information that is to be transmitted from unit 600 to sequencer 10 must pass through the shaft registers 604–606 and thence to line 174.

The second loop is a binary coded decimal (BCD) loop. It is a numeric data loop accommodating 32 bits. A first 16 bits are stored in shift registers 612 and 613, FIG. 7. The second 16 bits are stored in shift registers 614–617, FIG. 10. The loop through which the data flows includes the input line 618 connected to the A and B (NAND) input terminals of shift register 612. The data bits are clocked sequentially through register 612–617 and thence by way of the output line 619, NAND gate 620 and NAND gate 621 back to line 618.

Numeric data entered from the keyboard in unit 600 is placed into the loop 612–621 by way of a shift register 622. Four lines 623 lead to shift register 622. The states on line 623 are controlled by counters 624 and 625 as driven by a low speed clock (LSC) oscillator 626. Clock 626 is free running relative to clock 50 of sequencer 10. A second oscillator is provided along with oscillator 626. The second is a high speed clock (HSC) oscillator 626*a*. They operate at frequencies of about 180 kilohertz and 1.8 megahertz, respectively.

Oscillator (LSC) output line 627 leads to the clock input terminal of counter 624. The QD output terminal of counter 624 is connected by way of line 628 to the clock input terminal of counter 625. Counters 624 and 625 operate in conjunction with decoders 630 and 631 such that the outputs of decoders 630 scan the switches in the keyboard. Output states on lines 633 leading from decoder 631 strobe display 600*g* and strobe the outputs of the keyboard. i.e., output lines W2, W3, W6 and W7. Lines labeled $\overline{M0-M7}$ of FIG. 1A correspond with lines 632 of FIG. 7.

Line KBD2 from the keyboard leads to a NOR gate 634, the second input of which is the line W2 from the set 633. Similarly, keyboard line KBD3 leads to a NOR gate 635, the second input of which is line W3. Line KBD6 leads to a NOR gate 636, the second input of which is line W6. The line KBD7 leads to NOR gate 637, the second input of which is line W7. Gates 634 and 635 supply the inputs to a NOR gate 638. Gates 636 and 637 supply the inputs to a NOR gate 639. The output of gate 638 is connected through a single pulse circuit 640 to produce on output line 641 a digit clock pulse which is applied to the clock input terminal of register 622 to load into register 622 the code on lines 623 representing the numeric key on the keyboard that had been depressed. Pulses from clock oscillator 626 as provided by counter 624 through decoder 630 provide a keyboard strobing sequence. Line MO goes low initially, followed by lines M1 . . . M7 following which the line MO goes low again and the cycle is repeated. Gating into register 622 of the code on lines 623 is controlled by depressing a key on the keyboard. The particular code on lines 623 is the one that happens to be present at the instant of time that a particular pulse occurs in response to pressing a given key. The keyboard operation thus far described is essentially the same as in calculators manufactured and sold by Texas Instruments Incorporated of Dallas, Texas and identified as TI2500 Pocket Calculator.

Thus, actuation of any of keys 0–9 in set 600c will cause to be loaded into register 622 a binary code representative of the selected numeral 0–9.

The selected numeral in register 622 may then be inserted into the BCD loop and ultimately transferred into registers 604–606. The data placed in registers 604–606, except in a few cases which will hereinafter be discussed, is the I/O address of a given connector element located along cable 399. It will be recalled that there are, in the embodiment described, 256 input addresses and 256 output addresses along cable 399. In unit 400 the first eight units 400a are input units, the second eight units 400b are output units. As above described, the I/O address designates the location of such a connector unit as is employed to connect to motor 406, to switch 407, to switch 412, etc.

The programming unit 600 also serves to encode selected OP codes which are entered by actuating switches in the set 600f. Unit 600 also permits identifying desired I/O address modifiers by actuating one of the keys in set 600e.

The circuit operates to store the OP codes in register 602 and to store the I/O address modifiers in register 603. The circuitry associated with registers 602 and 603 permits manual insertion of a desired OP code or multiple OP codes and removal of one or all of the OP codes that have been inserted in order to give an operator flexibility in entering a given set of data representing a ladder network or modifying a set of data that has previously been loaded in the system. More particularly, actuation of a key to energize either lines KBD6 or KBD7 will cause data on lines 650 to be decoded for loading into registers 602 and 603. The logic circuits within the dotted outline 651 serve to decode data from lines 650 into binary form for storage in registers 602 and 603. The code stored in such registers is representative of the OP codes designated in FIGS. 1, 1A and 1B and associated with lines KBD6 and KBD7.

The states appearing at the outputs of the gates in unit 651 are set out in Table III.

TABLE III

| Key | 651b | 651c | 651d | 651e | 651f | 651g |
|-----|------|------|------|------|------|------|
| X   | 0    | 0    | 0    | 0    | 0    | 1    |
| Y   | 0    | 0    | 0    | 0    | 1    | 0    |
| CR  | 0    | 0    | 0    | 0    | 1    | 1    |
| AND | 1    | 0    | 0    | 0    | 0    | 0    |
| OR  | 1    | 0    | 1    | 0    | 0    | 0    |
| ST  | 0    | 0    | 0    | 1    | 0    | 0    |

TABLE III-continued

| Key | 651b | 651c | 651d | 651e | 651f | 651g |
|-----|------|------|------|------|------|------|
| CTR | 0    | 0    | 1    | 0    | 0    | 0    |
| OUT | 0    | 0    | 1    | 1    | 0    | 0    |
| MCR | 0    | 1    | 0    | 0    | 0    | 0    |
| INV | 0    | 1    | 0    | 0    | 0    | 0    |
| TMR | 0    | 1    | 1    | 0    | 0    | 0    |

Output states of Table III are generated as follows. Line W7 from set 633 is connected to one input of NAND gate 651a and to one terminal of AND gate 651b. The line W6 from set 633 is connected to one input of AND gate 651c and to one input of AND gate 651e. The three least significant bit lines of line 623 are then connected to the circuit 651. More particularly, the QA output of counter 625 is connected through an inverter 651h to the second input of NAND gate 651a and to the second input of AND gate 651c. The QD output of counter 624 is connected to the second input of AND gate 651d and to one input of AND gate 651f. The output of NAND gate 651a is connected to a second input of AND gate 651d and by way of inverter 651j to inputs to each of AND gates 651f and 651g.

The QC output of counter 624 is connected to the second input of AND gate 651e and to the second input of AND gate 651g.

The outputs of AND gates 651b–651g are connected to one input of exclusive OR gates 651m–651s, respectively. The QA–QD outputs of shift register 602 supply the second inputs of exclusive OR gates 651m–651q, respectively. The QA and QB outputs of shift register 603 supply the second inputs of exclusive OR gates 651r and 651s, respectively.

The data stored in shift register 602 is the OP code. There are sixteen OP codes employed in the present example. Such OP codes are set out in Table IV.

TABLE IV

| OP CODE | 651m | 651n | OUTPUT 651p | 651q |
|---------|------|------|------|------|
| JUMP | 0 | 0 | 0 | 0 |
| ST (LOAD) | 0 | 0 | 0 | 1 |
| CTR | 0 | 0 | 1 | 0 |
| OUT | 0 | 0 | 1 | 1 |
| MCR/INVERT | 0 | 1 | 0 | 0 |
| ST INVERT (LOAD) | 0 | 1 | 0 | 1 |
| TMR | 0 | 1 | 1 | 0 |
| OUT INVERT | 0 | 1 | 1 | 1 |
| AND | 1 | 0 | 0 | 0 |
| AND ST | 1 | 0 | 0 | 1 |
| OR | 1 | 0 | 1 | 0 |
| OR ST | 1 | 0 | 1 | 1 |
| AND INVERT | 1 | 1 | 0 | 0 |
| AND ST INVERT | 1 | 1 | 0 | 1 |
| OR INVERT | 1 | 1 | 1 | 0 |
| OR ST INVERT | 1 | 1 | 1 | 1 |

The data stored in shift register 603 is the I/O address modifier. There are three modifiers employed herein, as set out in Table V.

TABLE V

| Key | 651r | 651s |
|-----|------|------|
| X   | 0    | 1    |
| Y   | 1    | 0    |
| CR  | 1    | 1    |

All of the Op codes set out in Table IV are selectable by actuation of keys in set 600f, FIG. 1. Some of the OP codes, it will be noted, involve entries made by depressing two of the keys in set 600f and some by depressing three of the keys.

From an inspection of the circuit involving the exclusive OR gates 651m–651q, it will be seen that any OP code which appears at the output of unit 651 will be entered into register 602 if register 602 is clear. However, if the same OP code button is depressed a second time, then the feedback by way of channel 602a will cause the OP codes previously entered into register 602 to be erased. The circuit thus provides for a selected bit-by-bit entry into register 602 and bit-by-bit erasure thereof without otherwise modifying the operation of the programming unit 600 in any way. For example, referring to FIG. 1, assume an operator attempted to insert switch 412 and erroneously depressed the OR button in step 7 of the sequence above described in the previously given example rather than the AND button. If the operator then recognized the error and desired to correct the same, the correction could merely be made by depressing the OR button again followed by depression of the AND button. The sequence of operations would change the code in register 602 from 1010 to 1000. Thus the selective insertion and removal of a single bit to change the code. Use of the exclusive OR gates 651m–651q provides this unique sequence of operation, i.e., alternately entering and erasing a given code from register 602 upon repeated insertions of the same input command.

The same is true of the three lines leading to gates 651f and 651g of unit 651. They operate through exclusive OR gates 651r and 651s to control the LED displays 600j. At the same time, lines 603a are fed back to exclusive OR gates 651r and 651s for the selected control of the data in register 603.

The outputs of the shift register 602, in addition to being connected back to the exclusive OR gates 651m–651q, are also employed for controlling a light emitting diode display 600h. From the circuit shown, it will be seen that when a given button in the set 600f is depressed, the corresponding light emitting diode in display 600h will be illuminated. The diodess in set 600h, FIG. 9, bear the same legends as do the associated keys in the set 600f, FIG. 1. In a similar manner, the light emitting diodes labeled X, Y and CR of display 600j, shown in FIG. 10, are controlled by the QA and QB outputs of shift register 603.

The logic circuit 652 operates the same as the circuit 640 for controlled loading of registers 602 and 603.

It will be noted that a DIGIT CLOCK line is one of the outputs from circuit 640. This signals the fact that a digit code has been stored in register 622 and is to be inserted into the data loop that is being clocked through registers 612–617. This action is initiated by application of the $\overline{\text{DIGIT CLOCK}}$ signal to the load terminal of a state counter 653 and, through AND gate 654, to the clock input terminal of counter 653. Counter 653 is prewired so that it is forced to the count of five. The output lines QA–QD of counter 653 are connected to terminals A, B, C and STRB of a data selector unit 655 and to input lines of a decoder 656. Since the output from counter 653 is preset to five, the data selector 655 selects the signal on line 657 leading from a NOR gate 658 by way of an inverter 659.

A 32 bit word circulates in the second loop including shift registers 612–617. It continuously is shifted by SCAN clock pulses. Scan clock pulses are applied to the clock inputs of shift registers 612 and 613, and by way of NOR gate 660 to the clock input terminals of shift registers 614–617.

When a four bit word is stored in shift register 622, the object is to insert that word into the appropriate location in the 32 bit word already circulating in shift registers 612-617. The operation of the bit counter 653 and the data selector 655 in connection with decoder 656 causes a delay until the appropriate time for insertion arrives. This is caused by a delay interval during state 5 of data selector 655. Upon the occurrence of state 6 of data selector 656, the NAND gate 661 is enabled so that the output line QD from register 622, leading to NAND gate 662, will cause the word stored in register 622 to be inserted into the input of storage register 612. Data on line 619 then passes through register 622 trailing the word inserted into the loop from register 622. Thus, register 622 is included within the second data loop for 16 bits. During the state 6 from decoder 656, a NOR gate 663 is enabled. This causes signal MOW4 to be present. This generates through NOR gate 664 a load state on line 665 which leads to the load input terminals of binary coded decimal up/down counters 666–669. Counters 666–669 are connected to the shift registers 617–614, respectively. Line 665 also extends to the CLEAR terminals of binary counters 607–609 by way of inverter 655a.

Thus, the 16 bit data word is loaded in shift registers 666–669 and is to be converted to a binary counterpart which will be generated in counters 609–607. On state 7 of decoder 656 a high speed clock HSC applied by NAND gate 670 in conjunction with state 7 from decoder 656 enables AND gate 671 which is operated in an OR function so that HSC pulses then appear on clock line 672. Line 672 is then connected to the down input terminal of counter 666 and to the up input terminal of counter 609. Counters 666–669 then counter down to zero. During the same interval, counters 609–607 count up. At the instant that the counter 669 reaches zero count, a borrow signal appears on line 673 and is applied to NOR gate 674 which effectively is ANDed with state 7, thereby to apply by way of line 675 a load pulse to each of the load terminals of registers 604–606. At the instant of the borrow pulse, the contents of counters 607–609 are immediately captured in storage registers 604–606 and are thus available for reading out over line 611 to the sequencer.

In operation, the sequencer shown in FIGS. 3-6 once set in operation will repeat the wait-serial I/O-run modes following each peak in the a.c. power.

When programmer 600 is connected to the system and is to be used, the operation of the sequencer normally will continue uninterrupted. However, when the programmer of FIGS. 7–10 is placed in the read mode, the memory address specified by the operator is placed in counters 666–669. The counters then count down to zero. Upon reaching zero, the channels from NAND gate 601 and specifically, the enable terminals on registers 602, 603, 604, 605 and 606 are energized so that the words stored in memory at the location at the address initially specified in counters 666–669 will be brought out and stored in shift registers 602–606. Immediately, the LED displays 600h and 600j will be energized to display the contents of registers 602 and 603. The contents of registers 604–606 comprise the I/O address stored in the main memory location specified by the user. The I/O address thus contained in registers 604–606 is then loaded into counters 607–609. Counters 607–609 then count down to zero as counters 666–669 count up. When counters 607–609 reach zero, counters 666–669 stop counting. The output of the counters is then applied to the shift registers 614-617. The outputs thereof are then displayed. More particularly, the I/O address comprises 16 bits of the 32 bits circulating in the BCD loop. Each set of four of the 16 bits is latched by latch 690 whose output is applied to a decoder 691. The decoder 691 then is connected selectively to energize the segment drivers. One such segement driver is represented by the circuit 692. The 16 bits are thus employed to light up the left hand four digits on display 600g. The right hand four digits are decoded to display on the right hand four digits the memory address.

In the insert mode, an operator enters the desired data as above indicated. The OP code is stored in register 602. The modifier data is stored in shift register 603. The I/O address is entered into the BCD loop. The data is then transferred to the shift registers 604–606. In the run mode when the selected address is reached, the data from memory begins to flow to register 602 as data from register 606 begins to flow to memory. The data in memory is then passed as a serial stream through registers 602–606 until all the memory addresses have been read and rewritten in memory displaced by one memory address.

Entry of the numeric data, the entry of the Op codes and the entry of the I/O address modifiers has been described. Now to be described are the operations involving the entry of the five programmer mode commands, CLEAR, READ, WRITE, INSERT AND INCREMENT. The CLEAR push button of FIG. 1, when depressed, connects the CLEAR PB line of FIG. 9 to ground. This line is connected to an AND gate 900, the output of which is $\overline{CLEAR}$ signal. The output is also connected to an AND gate 901 and to the CLEAR terminals of registers 612 and 613. The output of gate 901 is connected to the CLEAR terminals of registers 602–606 and to the CLEAR terminals of registers 614–617.

When the READ button is depressed, line 902 is connected to ground. Line 902 leads to a NAND gate 903, the output of which is connected to a multivibrator 904 which is employed to prevent multiple entries of a single intended entry. More particularly, depression of a push button may close its switch several times. The circuit involving flip-flop 904 is a debouncing circuit having the output as a NOR gate 905. A line 906 serves to delay the signal thereby causing it to pass through gate 905 not before the multivibrator 904 has completed its cycle. The output of gate 905 is then supplied to one input of a NAND gate 907, the output of which is connected to the input terminal 0 of multiplexer 655. Second input of gate 907 is supplied by AND gate 908 which has as its inputs the M1W0 line from FIG. 7 and the OEN signal.

The INSERT push button and the WRITE push button also are connected to gate 903 and thus lead by way of gate 907 to the input 0 of multiplexer 655. The WRITE push button in addition to being connected to gate 903 is connected to a gate 909 and to the CLEAR Input terminal of a D-type flip-flop 910 by way of line 911. The WRITE push button is connected to gate 903 and to gate 909.

Three lines, RUN, PPGC and CPU3, are connected to the programming panel 600 from the sequencer of FIGS. 3–6. The RUN line is connected by way of inverter 913 to the clock input terminal of the D flip-flop 910 and to a gate 914. The Q output of flip-flop 910 is connected by way of inverter 915 to the clock input terminal of a B flip-flop 916. The output of gate 909 is connected to a CLEAR terminal of flip-flop 916 and to one input of a NAND gate 917. The output of NAND gate 917 is connected to an external load line 918 that leads to the sequencer. It is also connected through NAND gates 919 and 920.

The PPGC line from sequencer 10 is connected by way of inverter 921 to one input of gate 920.

The $\overline{CPU3}$ line, as previously described, is connected by way of line 232 through input 3 of multiplexer 655. It is also connected to NAND gate 922 and NOR gate 923. The $\overline{Q}$ output of the flip-flop 916 is connected as a second input to NAND gate 917. The Q output of the flip-flop 910 is connected as the third input to NAND gate 917.

The output of NAND gate 917 is a key signal in communication between the sequencer 10 and the programmer 600. More particularly, the state on line 918 controls whether or not the sequencer 10 will receive data from the programmer 600 which may appear on line 174. In the READ mode, line 918 stays high at all times.

In the WRITE mode, the state on line 918 is low only for that interval of time during which a single word of 16 bits is read from registers 602–606 over line 174 to sequencer 10.

In the INSERT mode, line 918 is high until counters 666–669 reach a count following a START signal corresponding to the address in memory at which it is desired to insert a new instruction. At that instant, the line 918 goes low and the data from registers 602–607 flows over line 174 to sequencer 10 until the end of the cycle is reached, i.e., until all of the remaining of the instructions from memory have been read through registers 602–606 and back into memory.

When the WRITE button is depressed, the CLEAR line to the flip-flop 910 is low and the CLEAR line to flip-flop 916 is high. Each time that the sequencer begins the RUN mode, the clock terminal of flip-flop 910 is actuated so that the Q output is clocked to the same as the D input, or is made to go low. Thus, when the WRITE button is depressed, the output of flip-flop 910 remains low until the 2Y3 output of the multiplexer 656 goes low. This resets the flip-flop 910, that is, it causes the Q output to go high. When the preset pulse is removed, the Q output again goes low. At this instant, the flip-flop 916 is clocked through inverter 915 so that the $\overline{Q}$ output is in a zero state. The output of gate 917 will go low only if all of the inputs are high. Thus, on the WRITE mode, the output of gate 917 is low only during the interval of time that the preset input to the flip-flop 910, i.e., the 2Y3 output of the multiplexers 656, is low.

The circuit involving flip-flops 910 and 916, NAND gate 909 and the demultiplexer 656 operates in the INSERT mode to keep line 918 low for the interval following which the output of 2Y3 of the demultiplexer 656 goes low and until the end of the RUN cycle. The line 918 is connected through a NOR gate 930 and a NOR gate 931 to the CLEAR terminal of counter 653. The second input of gate 930 is the 2Y3 output of multiplexer 656. The second input of NOR gate 931 is supplied by a NAND gate 932. One input of gate 932 is the 1Y3 output of demultiplexer 656. The other input is the 1Y0 output of demultiplexer 656. The circuit involving NAND gate 931 will reset counter 653 at the end of the 2Y3 state when in the INSERT mode and at the end of the 1Y0 state when in The READ or WRITE mode. It will reset counter 653 in response to the 1Y3 state at the end of the numeric entry mode.

When the INC button is depressed, the input to a Schmitt trigger 940 is connected to ground. This initiates the operation of incrementing any address that is then circulating in the BCD loop 612–617. The output of Schmitt trigger 940 is connected to a NAND gate 941 and to a second NAND gate 942 as well as to the CLEAR terminals of D flip-flops 943 and 944. The output of gate 941 is connected to the clock input terminal of flip-flop 943. The Q output of flip-flop 943 is connected by way of gate 945 to the clock input terminal of flip-flop 944. The output of gate 941 is connected by way of inverter 946 and NAND gate 947 to the input of an AND gate 948. The $\overline{Q}$ output of flip-flop 943 is connected to one input of OR gate 949 and to a second input of NAND gate 947. The Q output of gate 944 is connected to the second input of NOR gate 949. The $\overline{Q}$ output is connected to the second input of NAND gate 942. The output of NOR gate 949 is connected to one input of a NOR gate 940, the second input of which is supplied by way of NAND gate 951 which is driven from the 2Yo output of multiplexer 656 by way of inverter 952. The second input to gates 945 and 951 is the timing signal MOWO output line from FIG. 7.

In operation it will be remembered that a given address is circulating in the BCD loop 612–617. When it is desired to increment that address by a factor of one, then the INC button is depressed. This removes the CLEAR signal from flip-flops 943 and 944. Through gate 942 the OEN (zero enable) signal is disabled and thus is no longer effective on gate 908. Gate 941 also is enabled. Gate 941 is supplied by way of gate 955 which is supplied by the state 2Y0 multiplexer 656 and, by way of inverter 956 with the MOW4 state from FIG. 7.

If the operation involving multiplexer 655, counter 653 and the multiplexer 656 is in the Zero state and MOW4 state is created, then the output of gate 941 goes low and then high in response to and conforming with MZOW4. This clocks the flip-flop 943 causing the Q output to go high and the $\overline{Q}$ to go low. This enables gate 945 and disables gate 947. The output of gate 945 then clocks flip-flop 944 when the state MOWO from FIG. 7 is generated. On the first pulse out from gate 941, an output of gate 947 is pulsed low and is applied by way of AND gate 948 to the up count terminal of the counter 666 to increment at that instant the address that was then stored in the registers 666–669. At the same time, the signal is applied by way of AND gate 901 to clear the registers 614–617.

Before the INC button was depressed, the output of gate 942 was enabled so that through 908 the counter system could proceed through its cycle. Then the INC button is depressed, the output of gate 942 is disabled so that the counter system cannot proceed until after the increment operation has been completed. When the MOWO signal is applied to the flip-flop 944, the output of gate 942 is again enabled so that the counter 653 can then proceed with its operation.

TIMING — FIGS. 11A–C

Figure 11A:
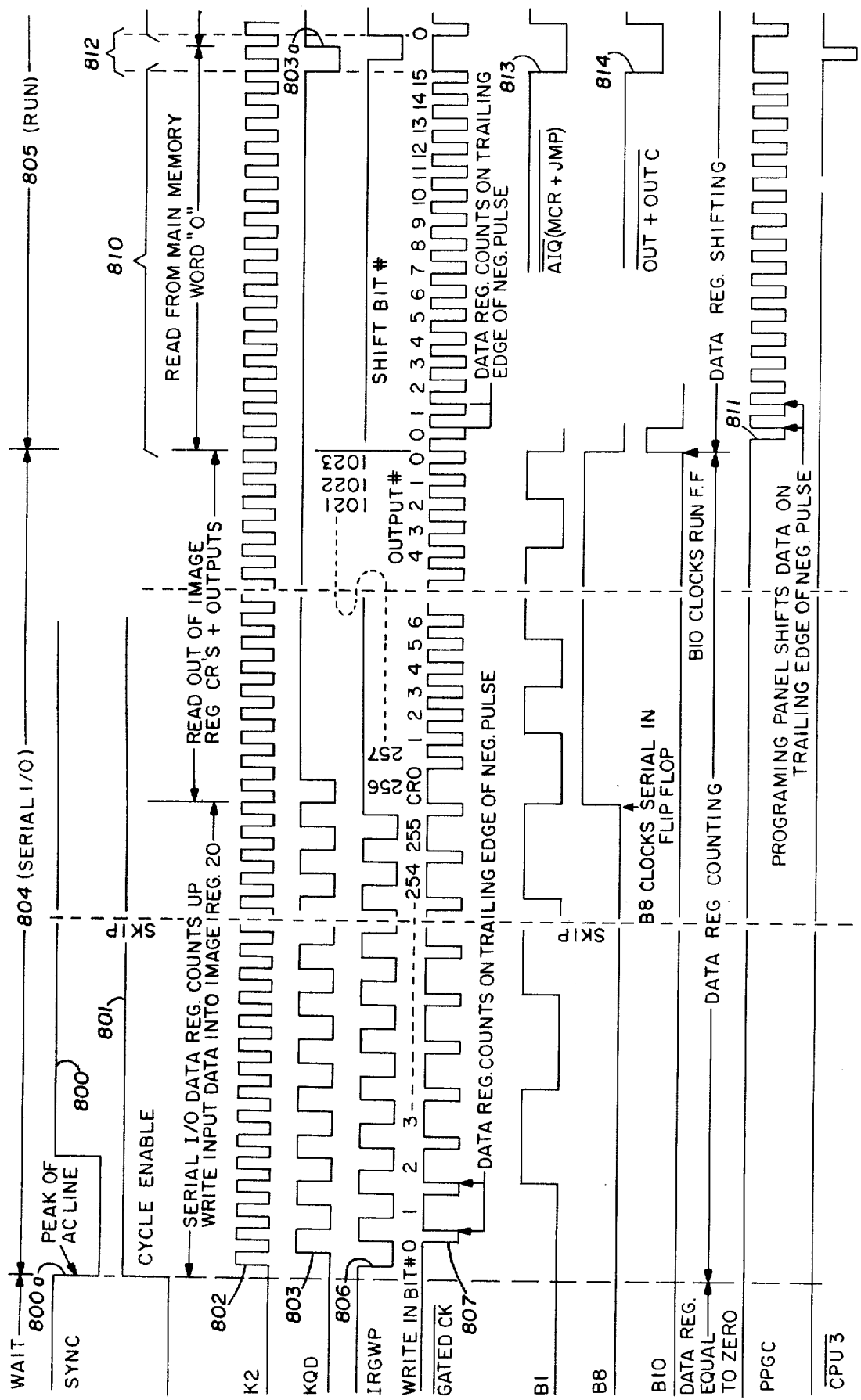
Figure 11B:
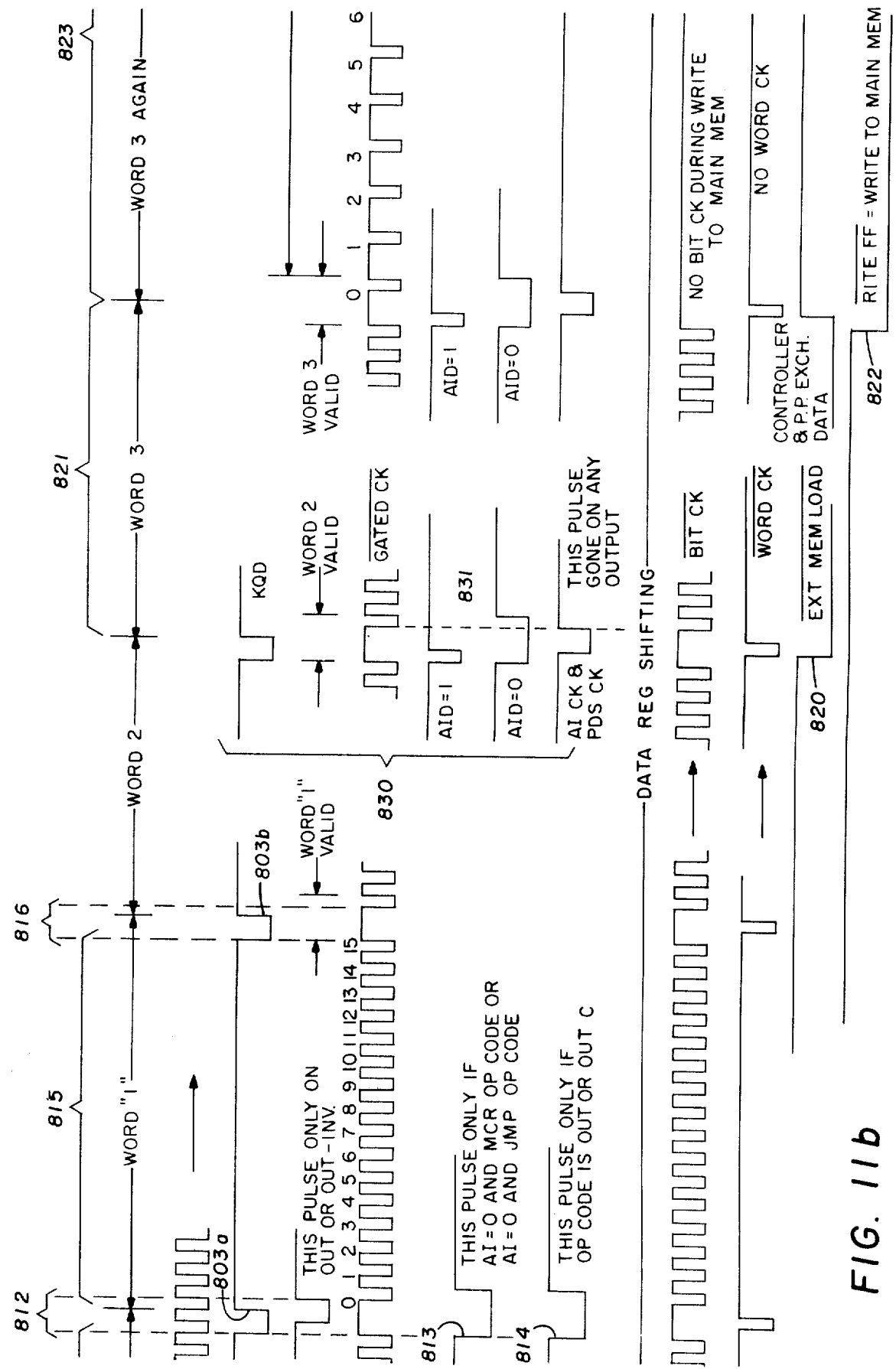

In FIG. 11A, certain timing functions employed in the system above described are illustrated. The functions illustrated in FIG. 11A will be given the same numeric labels as appear in FIGS. 2–6.

It will be remembered that sequencer 10 as above described operates through three modes, (a) wait, (b) serial I/O and (c) run. In FIG. 11A, waveform 800 illustrates the sync pulse supplied to line 11e, FIG. 3. The sync pulse waveform 800 is characterized by a step 800a at the peak of the a.c. voltage cycle.

Coincident with step 800a is the initiation of the serial I/O mode of sequencer 10. The cycle enable waveform 801 is generated at the output of NAND gate 11a and appears on line 81, FIG. 3.

Waveform K2 is one of the outputs of counter 39 and is a pulse train of one megacycle pulse rate. Oscillator 50, FIG. 4, in the embodiment here described had a frequency of 8 megacycles. The output KO of counter 39 had the frequency of 4 megacycles. The output K1 had the frequency of 2 megacycles while the output KO and K1 labeled on the drawings are not used in the operation of the system but are merely employed in counter 39. Thus, the waveform 802 is the one megacycle main control pulse K2.

Waveform 803 is the KQD signal appearing at the last output of counter 39. It runs at one-half the frequency of K2 or one-half megacycle pulse rate during the serial I/O mode of the sequencer. Thereafter it pulses one pulse every 16 of the K2 pulses having output pulses 803a, 803b, etc. Thus, the waveform 803 has a half megacycle rate during the I/O mode, a half megacycle rate divided by sixteen during the first part of the run mode and then reverts to the half megacycle pulse rate during the write-to-main-memory portion of the run mode.

In FIG. 11A, the serial I/O state begins when the waveform 801 goes high. The serial I/O state ends at the end of interval 804.

The run mode starts at the end of interval 804 and extends to the end of interval 805.

Waveform 806 is the image register write pulse that is applied to the R/W terminal of image register 20, FIG. 4.

Waveform 807 is the gate output signal appearing at the output NAND gate 109, FIG. 4. Thus, the data registers 13–15 count continuously during the I/O mode. During the time that waveform 806 is effective, the states of 256 input units on cable 399 are read into the image register 20 in the order 0, 1, 2 ... 254, 255. At the end of the serial input portion of the I/O mode, 512 flag states are read out of image register 20. They are read out at the higher clock rate of the K2 waveform 802. They are read out in the order 0, 1, 2, ... 510, 511.

Thereafter, the state on line 108, FIG. 3, reverses so that the order in which the output data stored in image register 20 is read out will be reversed. Thus, during the last portion of the serial I/O cycle, the states to be imposed upon the 256 output units on cable 399 are read out in reverse order. That is, the state of the most remote output unit on cable 399 is read out first. They are read out at the high clock rate K2 of waveform 802 and in the order 255, 254 ... 1, 0.

At this point, the end of the I/O state is reached and the system then operates in the run mode. The first portion of the run mode, namely the interval 810, is employed for the reading instructions from memory into data registers 12–15 at the main clock rate K2 of waveform 802. At the same time, a corresponding train PPGC at the K2 rate, represented by waveform 811, is generated and is the program panel gated clock pulse train. Thus, the program panel of FIG. 1 is the only element of the system that employs waveform 811.

During the interval 810, a memory word comprising 16 digits is read from the main memory into the data register.

During the interval 812, the instruction is executed by the sequencer 10. The waveform 813 is the $\overline{AIQ}$ $\overline{(MCR + JMP)}$ which appears at terminal Y3 of processor 61.

The waveform 814 is the signal $\overline{OUT + OUT\ C}$ which appears at the Y2 terminal of processor 61. In the interval 815, a second word is read out of memory and during the interval 816 the second word is executed. Thus, words 0 and 1 from memory are read and executed. Normally the sequencer would proceed to read and execute all instructions in memory.

In the example given in FIG. 11, a break in the memory sequence is shown. More particularly, after the execution of word 2, a step waveform 820 is generated which causes the data registers 12–15 to be loaded from the external memory, i.e., from memory in the programming unit 600. Waveform 820 appears on line 144 of FIG. 3. When present, the next word read into the data registers 12–15 is derived from the programming panel and is read in during the interval 821. At the end of the interval 821, the $\overline{RITE\ FF}$ waveform 822 is driven low. This terminates or inhibits the PPGC waveform 811 from being effective on the programming terminal 600 and causes the sequencer then to write the contents of the data registers 12–15 into memory at the word 3 location in memory, i.e., at the same location that was read out of memory during the interval 821. Thus, the memory write interval 823 is employed for each purpose. At the end of the interval 823, the waveform 822 then goes high, initiating flow of the PPGC pulses, waveform 811, to the programming panel 600 and continuing by reading word 4 from memory as in interval 824.

The foregoing operations then continue until the last of the instruction words in memory have been read and executed as desired has been accomplished. At this point in time, the $\overline{scan\ complete}$ signal, waveform 825, is generated. This signal appears at the output of the NAND gate 11, FIG. 3. The $\overline{scan\ complete}$ waveform 825 causes the cycle enable waveform 801 to go low and beginning at the end of interval 805, sequencer 10 waits for the next peak of the power voltage to repeat the same cycle again. The $\overline{end\ cycle}$ waveform 826 brings operations to a halt. In this state sequencer 10 remains until the next peak occurs.

It will be noted that the $\overline{scan\ complete}$ waveform 825 is applied to the clear input terminal of flip-flop 93 and the $\overline{end\ cycle}$ waveform 826 is applied to the preset terminal flip-flop 93 to produce waveform 822a, a negative going pulse. Pulse 822a assures that the last of the words from memory will be read and completely executed before the run mode interval 805 terminates. In each of intervals 821, 823 and 824, instruction words are read to or from memory, i.e., at the beginning of each such interval a set 830 of control pulses are generated. They comprise:

a KQD negative going pulse one microsecond long which, when it returns true, marks the beginning of a memory cycle as in interval 821;

a $\overline{gated\ ck}$ pulse, i.e., a positive pedestal of one and one-half microseconds in length extending one microsecond longer than the KQD pulse;

an AID pulse, either AID = 1 or AID = 0. The active indicator is flip-flop 86, FIG. 3. The AID signal is the signal applied to the D input of flip-flop 86.

If the Q output of the active indicator 86 is to be true as a result of the preceding memory cycle, then the signal applied to the D input terminal will have the form AID = 1 which is a negative going pulse which becomes true one-half microsecond before the end of KQD. If the Q output of active indicator 86 is to be false, then the signal applied to the D input of flip-flop 86 will have the form AIQ = 0, a pulse two microseconds long, going true one-half microsecond after dotted line 831. Dotted line 831 coincides in time with the trailing edge of a negative pulse AICK and PDS CK, i.e., the clock pulses applied to flip-flop 86 and the clock pulses applied to push down stack shift register 80.

The active indicator 86 shifts state on dotted line 831. Active indicator 86 holds results of execution of instruction and serves as a one bit wide accumulator. All store terms load new data into the active indicator. The push down stack shifts data down on two OP codes, shifts up on four OP codes and does nothing on ten OP codes.

More particularly, the push down stack has the responses indicated in Table VI to the sixteen OP codes involved.

TABLE VI

| OP CODE | PUSH DOWN STACK | |
|---|---|---|
| ST (STORE TERM) (LOAD) | Shift down | 0001 |
| ST-INV (STORE TERM, INVERT) (LOAD) | Shift down | 0101 |
| AND-ST (AND STORE TERM) | Shift up | 1001 |
| AND-INV-ST (AND, INVERT, STORE TERM) | Shift up | 1101 |
| OR-ST (OR, STORE TERM) | Shift up | 1011 |
| OR-INV ST (OR, INVERT, STORE TERM) | Shift up | 1111 |
| AND (AND) | No shift | 1000 |
| ANDC (AND COMPLEMENT) | No shift | 1100 |
| OR (OR) | No shift | 1010 |
| ORC (OR COMPLEMENT) | No shift | 1110 |
| OUT (OUTPUT) | No shift | 0011 |
| OUTC (OUTPUT COMPLEMENT) | No shift | 0111 |
| MCR (MASTER CONTROL RELAY) or INVERT | No shift | 0100 |
| JMP (JUMP) or NO OP | No shift | 0000 |
| TMR (TIMER) | No shift | 0110 |
| CTR (COUNTER) | No shift | 0010 |

Table VI includes the OP codes as they appear on lines B15–B12 leading from register 12, FIG. 3. More particularly, for the OP code, ST lines B15–B12 apply the four bit word 0001 to processor 61.

TIMING — FIG. 11D

Figure 11D:
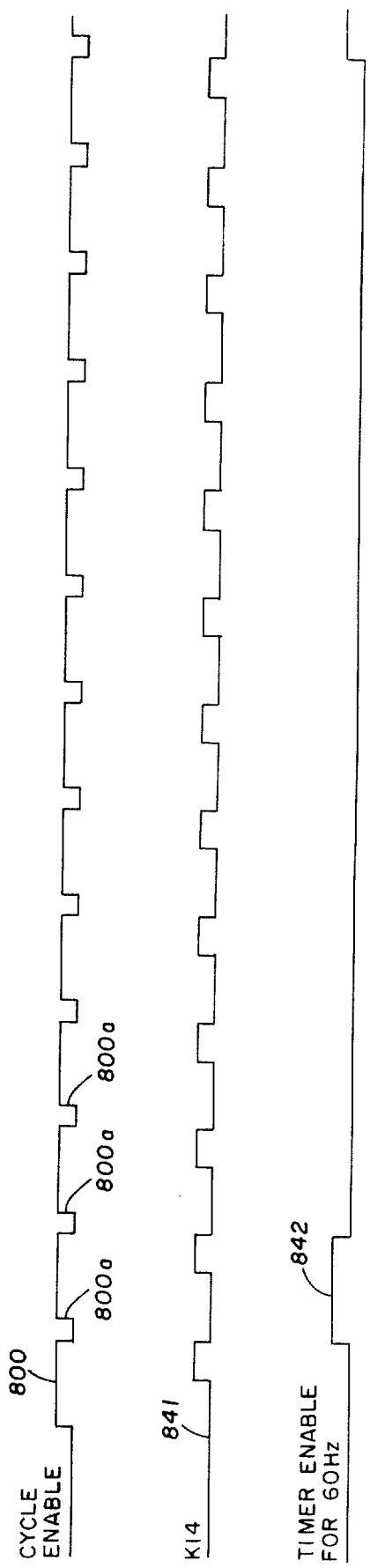

Referring to FIG. 11D, waveforms 800, 841 and 842 have been shown. The cycle enable waveform is the waveform appearing on line 81 at the output of NAND gate 11a. The peak of each a.c. half cycle occurs at the point 800a on waveform 800.

The K14 output of counter 38 involves a positive going pulse which occurs once for each half cycle of the a.c. power voltage. The K14 signal represented by waveform 841 is applied by way of inverter 96 to the clock input terminal of the timer counter 35. The timer enable signal illustrated by waveform 842 thus is caused to have an output pulse for every twelve pulses in the waveform 841. This means that the pulses on the timer enable waveform 842 occur at one-tenth second intervals. The output of the timer counter 35 is the CRY output. It is applied by way of liine 125 to the D input terminal of processor 61 and is employed for timing operation in utilization of the sequencer 10. Such a timer is indicated by the unit 417 of FIG. 1. The timing instructions are loaded in main memory and may thus be read from memory to become effective in controlling the operation of the sequencer. The control for such timing operations is involved in the programming set out in Tables I and II for processors 61 and 63, respectively.

TIMING — FIG. 11E

Figure 11E:
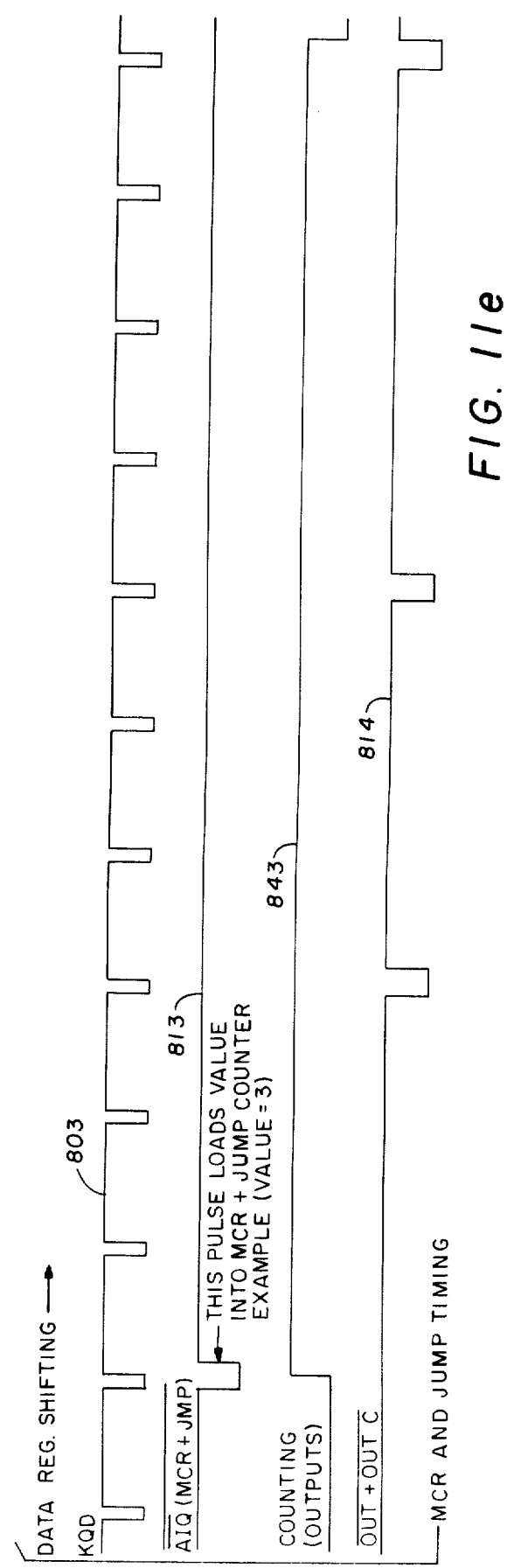

FIG. 11E illustrates the relationship between (1) the KQD waveform 803, (2) the $\overline{\text{AIQ}}$ ($\overline{\text{MCR+JMP}}$), waveform 813 which appears at the output of processor 61, (3) the counting output of the flip-flop 213, FIG. 6, as represented by waveform 843, and (4) the $\overline{\text{OUT+OUTC}}$ 814.

The KQD waveform 803 represents negative going pulses of one microsecond duration occurring every seventeen microseconds. The flip-flops 211, 212, 213 and 214 respond to the signals B0–B7 and to the AIQ ($\overline{\text{MCR+JMP}}$) to produce the counting output waveform 843. Three $\overline{\text{OUT+OUTC}}$ pulses are generated within the positive pedestal of the counting output waveform 843. Waveform 843 might extend for 256 $\overline{\text{OUT+OUTC}}$ pulses. The length of the counting waveform 843 depends upon the values of the inputs B0–B7, FIG. 6, at the instant that the $\overline{\text{AIQ}}$($\overline{\text{MCR+JMP}}$) pulse occurs.

Figure 14:
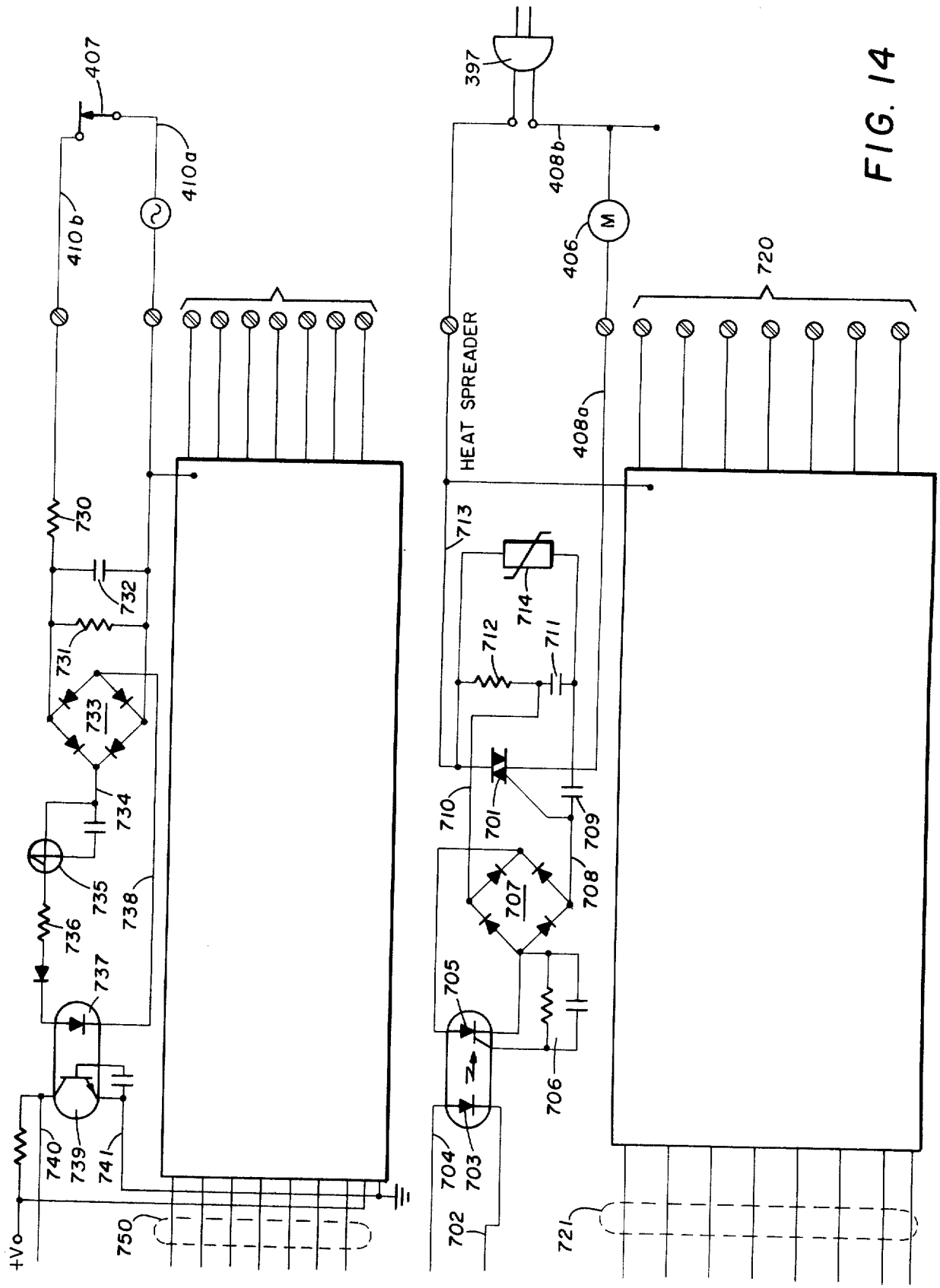

I/O UNITS — FIGS. 13 and 14

In FIG. 1 the controller 10 is shown connected by way of cable 399 to I/O units mounted on bases 400 and 401. Output unit 409 is shown mounted on base 400. Input unit 411 is shown mounted on base 401. The bases 400 and 401 are interconnected by way of a cable 399a. Base 401 is connected by way of cable 399b to additional bases so that, as above described, a total of 256 output units such as unit 409 may be employed along with a total of 256 inputs units such as input unit 411.

FIGS. 13 and 14 illustrate the manner in which power conveyed to the bases 400 and 401 as by way of power cables 397 and 398 is utilized. In the case of motor 406, the output unit 409 is utilized to control the application of power from cable 397 through lines 408 to motor 406. The interface to accomplish this is illustrated in FIGS. 13 and 14.

Cable 397 has one conductor which is connected to one terminal of a triac 701. The other terminal of triac 701 is connected by way of line 408a to one terminal of motor 406. The other terminal of motor 406 is connected by way of common line 408b to the second conductor in cable 397. The circuit responsive to controller 10 operates to turn on triac 701 upon a given output state from the controller 10.

Control for the triac 701 includes an output logic line 702 which leads by way of a light emitting diode 703 in line 704 to a positive voltage source. When the state on line 702 is false, triac 701 is turned on. This is done by sensing light from diode 703 in a photosensor SCR 705. SCR 705 is connected to an RC filter circuit 706. It is also connected by way of a full wave rectifying diode bridge 707 to the triac 701. More particularly, the line 708 is connected to the gate of triac 701 and, through capacitor 709, to line 408a. The upper terminal of bridge 707 is connected by way of line 710 to the juncture between filter capacitor 711 and filter resistor 712. The upper terminal of resistor 712 is connected to the upper elecctrode of triac 701 and by way of line 713 to the power cable 397. The transient clipper unit 714 is connected in parallel to the filters 711 and 712.

In FIG. 14 the single output circuit is shown as utilized to drive or otherwise control motor 406. Identical circuits will then be provided for controlling the application of a.c. power to the additional seven output channels 720. Since the control circuits are identical to that described for channel 702, they will not be further described.

Referring again to FIG. 1, the switch 407 is opened or closed by the position of the XY table 404. The switch 407 leads by way of cable 410 to the input unit 411 on base 401. The state of the switch 407 is employed to utilize power from cable 398 in the base 401 to signal by way of cable 399a the switch state. FIG. 14 illustrates the input circuits in one base. In this circuit, the power source is connected to the system by way of cable 398. The switch 407 is connected by way of line 410a to one of the power conductors in cable 398. The other terminal of switch 407 is connected by way of line 410b through a voltage divider comprising resistors 730 and 731 back to the other terminal of the line 398. A capacitor 732 is connected in parallel to resistor 731 to provide a filter network.

Resistors 730 and 731 drop the voltage as it is applied to full wave rectifying diode bridge 733 to about 12 volts. The bridge is connected by way of line 734 to a trigger unit 735 and thence by way of resistor 736 to a light emitting diode 737. The second terminal of diode 737 is connected by way of line 738 back to the other terminal of the bridge 733. Light emitting diode 737 is on when switch 407 is closed. When diode 737 is turned on, light therefrom is sensed by a phototransistor 739. Transistor 739 when conducting causes the state on output line 740 to be false. The other line 741 from transistor 739 is connected to ground. Thus, the circuit described in FIG. 14 serves to control the state on line 740 as to be low when switch 407 is closed.

Seven additional input lines 750 are provided in the circuit of FIG. 14 with control circuits identical to those described to control the state of output line 740.

It will be now seen that the base 400 serves as a mounting for the output unit 409. The base 401 serves as a mounting for the input unit 411.

In the circuit illustrated in FIGS. 13 and 14, an arrangement is provided wherein the logic in a single base is available for accommodating both output units such as output unit 409 and input units such as input unit 411 on the same base. In the system of FIG. 13, multi-terminal plug 399c connects cable 399 into the base 400. Plug 399d serves to terminate the cable 399a in base 400. A similar plug 399e is connected into base 401 and plug 399f connects cable 399d to base 401.

In FIG. 13, line 702 and its companion lines 721 are connected to the eight inputs of two four-bit parallel-in/parallel-out shift registers 760 and 761. Registers 760 and 761 are connected by way of lines 762 to the outputs of an eight bit serial-in parallel-out shift register 763. The output data line from controller 10 connected through plug 399c to the line 764 by way of an inverter 765 to the data input terminals of register 763. The Qh output line 766 is then connected by way of inverter 767 to the output data line leading to plug 399d. Thus, a train of output data issues from the controller 10 during each half cycle of the power voltage. It enters the unit 400 and passes through shift register 763 under control of a train of clock pulses, one new bit entering for each clock pulse. The I/O clock states on line 768 are applied by way of an inverter gate 769 to the clock input terminal of shift register 763. The I/O clock line 768 is also connected to an I/O clock terminal in plug 399d. Thus, it will be recalled that when the controller 10 reads data out onto the cable 399, 256 bits are read out during each half cycle of the power voltage. The first bit read out will be stored in a register such as register 763 in the last of a series of base units located on down the cable from section 399d. The last of the 256 output bits will be stored in the first bit location in register 763.

With the I/O clock signal inhibited, the output data is then latched into registers such as register 763. During the zero crossing of the a.c. voltage in controller 10, a state is applied by way of the I/O latch line 770 through inverter 771 and line 772 to the clock terminals of the shift registers 760 and 761. This shifts the data in register 763 into the shift registers 760 and 761, thus controlling the output states on lines 702 and 721 thereby either energizing or deenergizing, as the case may be, the lines 408a and the lines 720.

Input logic line 740 and its companion lines 750 are connected into an eight bit parallel-in, serial-out shift register 775. The I/O latch state on line 770 changes from the input mode to the output mode following each train of input data to controller 10. By way of inverter 780, the states of the voltages on line 740 and lines 750 are caused serially to be read onto the line 776 and thence through inverter 777 to the input data terminal on plug 399c.

It will be noted that the input data terminal of plug 399d is connected by way of inverter 778 and line 779 to the serial input terminal of register 775. By this means, when the system is in the input mode, all of the states on lines 740 and 750 plus the states on an additional 248 similar lines in companion bases, all capable of being handled by the system, are then funneled by way of line 779 through shift register 775.

The cable leading to plug 399c has an input data line, an I/O latch line, an I/O clock line, an output data line, a +7.5 volt line, an LED power line, a set of logic ground lines and a thermal fault line.

In the embodiment above described, various integrated components were employed in the manner indicated. Logic units are indicated by conventional symbols. Other elements employed are identified as set out in Tables VII-IX.

TABLE VII

| Unit | |
|---|---|
| R/W memories 20, 25, 26, 27 and 28 | 1024 bit R/W memory manufactured and sold by M.I.L. of Canada, Ottawa, Canada, Catalog No. 2102 |
| Counters 12–15, 35–39 and 63 | Counter manufactured and sold by Texas Instruments Incorporated, Dallas, Texas, Catalog No. SN 74163-N |
| ROMs 30–33, 61 and 62 | Processor PROM manufactured and sold by Harris Semiconductor, Inc., Melbourne, Florida and identified by Cat. No. H. PROM 1-1024-5B |
| Shift register 80 | Manufactured and sold by Texas Instruments Incorporated and identified as SN 74194 N |
| Flip-flops 21, 86, 193, 213, 214 | Manufactured and sold by Texas Instruments Incorporated and identified by SN 7474 N |

TABLE VII-continued

| Unit | |
|---|---|
| Counters 93, 95, 211, 212, 226, 230 and 237 | Manufactured and sold by Texas Instruments Incorporated and identified by SN 74193 N |
| Demultiplexers 175, 177 | Dual two-four line demultiplexer, manufactured and sold by Texas Instruments Incorporated and identified by SN 74155 N |
| Multiplexer 190 | One half of a dual four-one line multiplexer manufactured and sold by Texas Instruments Incorporated and identified by SN 74153 N |

TABLE VIII

| Unit | |
|---|---|
| Decoders 630, 631 and 656 | Three-eight line decoder, manufactured and sold by Texas Instruments Incorporated, Dallas, Texas and identified by Sn 74155N |
| Shift registers 612 and 613 | Eight bit shift register, manufactured and sold by Texas Instruments Incorporated and identified by SN 74164N |
| Counters 624, 625 | Counter manufactured and sold by Texas Instruments Incorporated and identified by SN 74177N |
| Shift registers 602–616, 614–617 and 622 | Shift register manufactured and sold by Texas Instruments Incorporated and identified by SN 74195N |
| Up/down counters 607–609 | Binary up/down counters manufactured and sold by Texas Instruments Incorporated and identified by SN 74193N |
| Up/down counters 666–668 | Decode up/down counters manufactured and sold by Texas Instruments Incorporated and identified by SN 74192N |
| Latch 690 | Four bit latch manufactured and sold by Texas Instruments Incorporated and identified by SN 7475N |
| Decoder 691 | BCD to seven segment decoder manufactured and sold by Texas Instruments Incorporated and identified by SN 7448N |
| Counter 653 | Binary four bit counter manufactured and sold by Texas Instruments Incorporated and identified by SN 74163N |
| Counter 655 | Eight to one line demultiplexer manufactured and sold by Texas Instruments Incorporated and identified by SN 74151N |

TABLE IX

| Unit | |
|---|---|
| Shift register 775 | Eight bit parallel-in, serial-out shift register manufactured and sold by Texas Instruments Incorporated and identified by SN 74165N |
| Shift register 763 | Eight bit serial-in, parallel-out shift register manufactured and sold and Texas Instruments Incorporated and identified by SN 74164N |
| Shift registers 760, 761 | Four bit parallel-in, parallel-out shift register (latch) manufactured and sold by Texas Instruments Incorporated and identified by SN 74195N |
| Couplers 737–739 | Optical coupler manufactured and sold by Texas Instruments Incorporated and identified by TIL111 |
| SCR 703–705 | Opto-SCR units manufactured and sold by Monsanto Semiconductor, Inc., Cupertino, California and identified by No. MCS 240 |

The programmable logic controller with flag storage described herein is described and claimed in copending application, Ser. No. 431,589, filed Jan. 7, 1974 by Bobby George Burkett and Raymond Wilson Henry.

Program logic control with push down stack described herein is described and claimed in copending application, Ser. No. 431,538, filed Jan. 7, 1974 by Bobby George Burkett and Raymond Wilson Henry.

Having described the invention in connection with certain specific embodiments thereof, it is to be understood that further modifications may now suggest themselves to those skilled in the art and it is intended to cover such modifications as fall within the scope of the appended claims.

What is claimed is:

1. In a programmable logic controller, the combination comprising:
   a. a read/write memory for storing multibit instructions which direct computations in said controller;
   b. a programming keyboard module connected to said controller for encoding instructions to be stored in said memory;
   c. means operable cyclically to read said instructions from said memory for operation of said controller;
   d. a temporary storage means;
   e. program counter means for generating memory addresses;
   f. first logic means responsive to a first keyboard command for transferring instructions from said keyboard module via said temporary storage means to said memory; and g. second logic means responsive to a second keyboard command for inserting a new instruction at a location in said memory having a designated address and sequentially shifting each instruction in said memory stored at a location having an address beyond said designated address to a memory location having an address once removed, said second logic means including:
      i. means for transferring said new instruction to said temporary storage means;
      ii. means for setting said program counter means to said designated address;
      iii. means for transferring the instruction in said temporary storage means to said memory at the address according to said program counter means and concomitantly transferring the instruction at said address to said temporary storage means; and
      iv. means for controlling said program counter means to sequentially access each address beyond said designated address.

2. The combination according to claim 1 wherein said temporary storage means is a serial-in serial-out shift register in said keyboard module and wherein said second logic means includes means for transferring one bit at a time of the instruction in said shift register to the addressed location of said memory according to said program counter means and concomitantly transferring one bit at a time of the instruction at said addressed location to said shift register.

3. The combination according to claim 1 including:
   a. a memory address counter in said keyboard module;
   b. means in said second logic means for presetting said memory address counter to a count corresponding to said designated address according to said second keyboard command;
   c. means for synchronously decrementing said memory address counter to zero and incrementing said program counter means; and
   d. means operable upon zero count of said memory address counter to initiate the transfer of said new instruction from said temporary storage means to said memory at the address according to said program counter means.

4. In a programmable controller for controlling the on/off states of $m$ output devices in response to computed states generated by execution of a stored program on n binary parameters, wherein the value of each of said parameters corresponds to the on/off state of a respective input device, and wherein said controller is responsive to an alternating current power signal, the combination which comprises:
   a. a register means having at least $m + n$ binary storage locations;
   b. control means responsive to a predetermined point in each cycle of said alternating current power signal for selectively generating an initiate input/output control signal and an initiate execution control signal;
   c. first means responsive to said initiate input/output control signal for serially storing the n binary parameters corresponding respectfully to the on/off states of said n input devices into said register means and for serially reading previously computed on/off states for said $m$ output devices out of said register means for transmission to said output devices; and
   d. second means responsive to said initiate execution control signal for causing executing of said stored program with the values of said n binary parameters corresponding to the on/off states of the $n$ input devices stored in said register means to thereby compute next states for said m output devices and for storing such next states in said register means.

5. The combination according to claim 4 wherein:
   a. said control means includes:
      i. a bistable device responsive to a condition at said predetermined point for changing from a first state to a second state thereby generating said initiate input/output control signal,
      ii. an address counter coupled to said register means for addressing the storage locations of said register means, and
      iii. means coupled to -aid address counter and responsive to said initiate input/output control signal for incrementing said counter; and wherein
   b. said first means includes:
      i. an input transfer gate coupled to said register means for serially transferring the on/off states of said n input devices into said register means in response to a first enable signal,
      ii. an output transfer gate coupled to said register means for serially transferring the previously computed on/off states for said m output devices out of said register means to said output devices in response to a second enable signal, and
      iii. enable means coupled to said address counter and to said input and output transfer gates, said enable means being responsive to the count of said address counter for selectively generating said first or second enable signal.

6. The combination as set forth in claim 4 wherein:
   a. the controller includes a processor coupled to said register means for executing the stored program on the n binary parameters stored in said register means to compute the on/off states for said m output devices; and wherein b. said control means includes:
   i. an address counter,
   ii. means coupling the address counter to said register means for addressing the storage locations of said register means, and
   iii. means responsive to said initiate input/output control signal for incrementing said counter to store said n binary parameters and responsive to said initiate execution control signal to activate said exclusive OR gates to decrement the address counter to said register for reading the n binary parameters out of said register to said processor.

7. The combination according to claim 4 including:
   a. sampling means for sampling the on/off states of said n input devices and generating said n binary parameters corresponding respectfully to the on/off states of said n input devices; and
   b. parallel in-serial out shift register means coupling said sampling means to said register means for serially transferring said $n$ binary parameters to said register means.

8. The combination according to claim 4 including serial in-parallel out shift register means coupling said register means to said output devices whereby the previously computed on/off states for said m output devices which are serially transmitted to said output devices are received by said output devices in parallel.

9. In a sequencer system having a read/write memory for storage of a set of instructions to be read and executed serially during a memory cycle, the combination which comprises:
   a. a first shift register;
   b. means for transferring instructions from read/write memory to said first shift register and for shifting said instructions bit-wise through said first shift register for execution thereof under control of a system clock;
   c. a second shift register for temporary storage of a new instruction to be inserted into said set;
   d. a counter means;
   e. means for entering into said counter means an address of a location of said read/write memory which said new instruction is to occupy;
   f. means operable at a predetermined relation to the beginning of a memory cycle for commencing incrementing of said counter means;
   g. means coupled to said counter and responsive to the contents thereof for directing the contents of said second shift register to said first shift register when said counter means reaches a count corresponding to the address of the location of said read/write memory which said new instruction is to occupy; and
   h. means for writing into said read/write memory said new instruction and each instruction thereafter passing through said first shift register.

10. In a programmable logic controller having a read/write memory and means operable serially and cyclically for reading instructions from said memory for operation of said controller, the combination which comprises:
   a. a programming keyboard for encoding instructions, said keyboard including:
      i. a numeric set of switches for entering numeric data,
      ii. an OP code set of switches to enter OP codes, and
      iii. a set of command switches for entering commands; and
   b. logic means responsive to commands from said keyboard to transfer instructions from said keyboard to said memory as a serial-bit stream, said logic means including:
      i. a first data loop including a gated channel leading from said memory and a first string of shift registers,
      ii. a second data loop including a second string of shift registers,
      iii. means coupling said numeric set of switches in said keyboard to said second data loop,
      iv. means coupling said OP code set of switches in said keyboard to a first port of said first string of shift registers,
      v. means for counting the instructions read from memory in each cycle of said controller,
      vi. means responsive to a command by said keyboard for shifting numeric contents of said second loop to a second port of said first string of shift registers and simultaneously to gate said channel to direct contents of said first string of shift registers to said memory at a preselected memory location, and
      vii. means responsive to a keyboard insert command to insert a new instruction at a designated address in said memory and sequentially to shift each serially accessed instruction in said memory stored at an address beyond said designated address to a memory address once removed.

* * * * *